(12) United States Patent
Xin et al.

(10) Patent No.: US 12,155,399 B2
(45) Date of Patent: *Nov. 26, 2024

(54) METHOD FOR AUTO-DETECTION OF WLAN PACKETS USING STF

(71) Applicant: Huawei Technologies Co., Ltd., Shenzhen (CN)

(72) Inventors: Yan Xin, Kanata (CA); Sheng Sun, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/300,907

(22) Filed: Apr. 14, 2023

(65) Prior Publication Data

US 2023/0253986 A1    Aug. 10, 2023

Related U.S. Application Data

(60) Continuation of application No. 17/028,592, filed on Sep. 22, 2020, now Pat. No. 11,637,572, which is a
(Continued)

(51) Int. Cl.
*H03M 13/00*    (2006.01)
*H04L 1/00*    (2006.01)
(Continued)

(52) U.S. Cl.
CPC ...... *H03M 13/6527* (2013.01); *H04L 1/0091* (2013.01); *H04L 5/0053* (2013.01);
(Continued)

(58) Field of Classification Search
CPC ....... H04L 45/306; H04L 45/74; H04L 67/10; H04L 12/4633; H04L 2212/00;
(Continued)

(56) References Cited

U.S. PATENT DOCUMENTS 8,175,119 B2    5/2012  Zhang et al.
8,331,419 B2    12/2012  Zhang et al.
(Continued)

FOREIGN PATENT DOCUMENTS

CN    101647242 A    2/2010
CN    102017488 A    4/2011
(Continued)

OTHER PUBLICATIONS

Cordeiro, "IEEE P802.11 Wireless LANS, 802.11 NG60 Sg Proposed PAR," IEEE 802.11-14/1151r3, Sep. 14, 2014, 5 pages.
(Continued)

*Primary Examiner* — Man U Phan
(74) *Attorney, Agent, or Firm* — Slater Matsil, LLP

(57) ABSTRACT

A method of auto-detection of WLAN packets includes selecting a first Golay sequence from a first pair of Golay complementary sequences associated with first packet type, each Golay sequence of the first pair of Golay complementary sequences being zero correlation zone (ZCZ) sequences with each Golay sequence of a second pair of Golay complementary sequences associated with a second packet type, and transmitting a wireless packet carrying a short training field (STF) that includes one or more instances of the first Golay sequence.

20 Claims, 35 Drawing Sheets

Related U.S. Application Data division of application No. 15/043,089, filed on Feb. 12, 2016, now Pat. No. 10,813,083.

(60) Provisional application No. 62/219,794, filed on Sep. 17, 2015, provisional application No. 62/115,445, filed on Feb. 12, 2015.

(51) Int. Cl.

| | | |
|---|---|---|
| *H04L 5/00* | (2006.01) | |
| *H04L 27/00* | (2006.01) | |
| *H04L 27/20* | (2006.01) | |
| *H04L 27/26* | (2006.01) | |
| *H04L 27/34* | (2006.01) | |
| *H04L 69/18* | (2022.01) | |
| *H04L 69/22* | (2022.01) | |
| *H04W 72/23* | (2023.01) | |
| *H03M 13/11* | (2006.01) | |
| *H03M 13/27* | (2006.01) | |
| *H03M 13/29* | (2006.01) | |
| *H04W 84/12* | (2009.01) | |

(52) U.S. Cl.
CPC ........ *H04L 27/0012* (2013.01); *H04L 27/206* (2013.01); *H04L 27/2601* (2013.01); *H04L 27/2613* (2013.01); *H04L 27/3455* (2013.01); *H04L 69/18* (2013.01); *H04L 69/22* (2013.01); *H04W 72/23* (2023.01); *H03M 13/1102* (2013.01); *H03M 13/27* (2013.01); *H03M 13/2906* (2013.01); *H04L 2001/0098* (2013.01); *H04L 5/0023* (2013.01); *H04L 5/0048* (2013.01); *H04L 27/26132* (2021.01); *H04L 27/2666* (2013.01); *H04W 84/12* (2013.01)

(58) Field of Classification Search
CPC ... H04L 12/4641; H04L 49/20; H04L 12/741; H04L 29/08; H04L 12/725; H04L 12/46; H04L 12/931
USPC .......................................................... 370/338
See application file for complete search history.

(56) References Cited

U.S. PATENT DOCUMENTS

| | | | |
|---|---|---|---|
| 8,331,518 B2 | 12/2012 | Sawai et al. | |
| 8,462,720 B2* | 6/2013 | Hong | H04W 28/06 370/341 |
| 8,724,724 B2 | 5/2014 | Xin et al. | |
| 8,830,917 B1 | 9/2014 | Zhang et al. | |
| 8,885,669 B2 | 11/2014 | Zhang et al. | |
| 8,891,592 B1 | 11/2014 | Zhang et al. | |
| 8,929,397 B2 | 1/2015 | Zhang et al. | |
| 8,958,462 B2 | 2/2015 | Xin et al. | |
| 8,989,287 B2 | 3/2015 | Zhang et al. | |
| 9,253,619 B2 | 2/2016 | Liu et al. | |
| 9,332,514 B2 | 5/2016 | Sorin | |
| 9,504,038 B2* | 11/2016 | Kasher | H04W 28/26 |
| 9,584,262 B2 | 2/2017 | Kim et al. | |
| 9,647,730 B2* | 5/2017 | Ko | H04L 1/0071 |
| 9,660,760 B2* | 5/2017 | Kasher | H04L 1/0079 |
| 9,900,196 B2* | 2/2018 | Tarighat Mehrabani | H04L 27/18 |
| 10,021,695 B2* | 7/2018 | Eitan | H04L 27/2601 |
| 10,116,362 B2 | 10/2018 | Wang et al. | |
| 10,250,370 B2 | 4/2019 | Yan et al. | |
| 10,298,335 B1 | 5/2019 | Xin et al. | |
| 10,609,715 B2 | 3/2020 | Sadiq et al. | |
| 10,727,994 B2* | 7/2020 | Sanderovich | H04L 27/26132 |
| 10,813,083 B2 | 10/2020 | Xin et al. | |
| 10,840,993 B2 | 11/2020 | Kim et al. | |
| 10,862,565 B2* | 12/2020 | Kim | H04B 7/0636 |
| 11,115,964 B2 | 9/2021 | Xin et al. | |
| 11,290,211 B2* | 3/2022 | Lomayev | H04L 5/0048 |
| 11,290,957 B2 | 3/2022 | Lin et al. | |
| 11,469,845 B2* | 10/2022 | Lin | H04L 27/2614 |
| 11,722,191 B2* | 8/2023 | Oteri | H04W 72/23 370/338 |
| 11,743,089 B2* | 8/2023 | Huh | H04L 27/2695 375/340 |
| 11,838,565 B2* | 12/2023 | Bae | H04L 1/16 |
| 2004/0066740 A1 | 4/2004 | Suh et al. | |
| 2005/0223193 A1 | 10/2005 | Knowles | |
| 2006/0002582 A1 | 1/2006 | Suehiro et al. | |
| 2007/0121946 A1 | 5/2007 | Ito et al. | |
| 2008/0181320 A1 | 7/2008 | Asanuma et al. | |
| 2008/0181323 A1 | 7/2008 | Waters et al. | |
| 2009/0149132 A1 | 6/2009 | LeFever et al. | |
| 2009/0185549 A1 | 7/2009 | Shon et al. | |
| 2009/0285319 A1 | 11/2009 | Zhang et al. | |
| 2009/0290600 A1 | 11/2009 | Tatsuta et al. | |
| 2010/0091911 A1 | 4/2010 | Sawai et al. | |
| 2010/0329366 A1 | 12/2010 | Wang et al. | |
| 2011/0044271 A1 | 2/2011 | Hong et al. | |
| 2011/0051705 A1 | 3/2011 | Jones, IV et al. | |
| 2011/0063991 A1 | 3/2011 | Sampath et al. | |
| 2011/0116487 A1 | 5/2011 | Grandhi | |
| 2011/0149927 A1 | 6/2011 | Stacey et al. | |
| 2011/0235721 A1 | 9/2011 | Chen et al. | |
| 2012/0057483 A1 | 3/2012 | Kim et al. | |
| 2012/0155447 A1 | 6/2012 | Vermani et al. | |
| 2012/0201276 A1 | 8/2012 | Zhang et al. | |
| 2012/0207181 A1 | 8/2012 | Zhang et al. | |
| 2012/0207192 A1 | 8/2012 | Zhang et al. | |
| 2012/0294295 A1 | 11/2012 | Webster et al. | |
| 2013/0064124 A1 | 3/2013 | Sun | |
| 2013/0107912 A1 | 5/2013 | Ponnampalam | |
| 2013/0136198 A1 | 5/2013 | Chavali et al. | |
| 2013/0150033 A1 | 6/2013 | Gossain et al. | |
| 2013/0235884 A1 | 9/2013 | Mamidwar et al. | |
| 2013/0322279 A1 | 12/2013 | Chincholi et al. | |
| 2014/0071892 A1 | 3/2014 | Liu et al. | |
| 2014/0086362 A1 | 3/2014 | Dhayni | |
| 2014/0126390 A1 | 5/2014 | Teplitsky et al. | |
| 2014/0133592 A1 | 5/2014 | Ko et al. | |
| 2014/0146716 A1 | 5/2014 | Chen et al. | |
| 2014/0204927 A1 | 7/2014 | Horn et al. | |
| 2014/0204928 A1 | 7/2014 | Sorin | |
| 2014/0233478 A1 | 8/2014 | Wentink et al. | |
| 2014/0321479 A1 | 10/2014 | Zhang et al. | |
| 2014/0369213 A1 | 12/2014 | Kim et al. | |
| 2015/0200720 A1 | 7/2015 | Moulsley et al. | |
| 2015/0244432 A1 | 8/2015 | Wang | |
| 2015/0381311 A1 | 12/2015 | Zhang et al. | |
| 2016/0006557 A1 | 1/2016 | Shirakawa et al. | |
| 2016/0150591 A1 | 5/2016 | Tarighat Mehrabani et al. | |
| 2016/0192363 A1 | 6/2016 | Kasher et al. | |
| 2016/0204898 A1 | 7/2016 | Ghosh et al. | |
| 2016/0226622 A1 | 8/2016 | Kasher et al. | |
| 2017/0047989 A1 | 2/2017 | Oh et al. | |
| 2017/0171861 A1 | 6/2017 | Seok | |
| 2020/0196190 A1 | 6/2020 | Park et al. | |
| 2021/0344539 A1 | 11/2021 | Kim et al. | |

FOREIGN PATENT DOCUMENTS

| | | |
|---|---|---|
| CN | 102246450 A | 11/2011 |
| EP | 2175445 A3 | 5/2010 |
| EP | 2712138 A2 | 3/2014 |
| JP | 2008010904 A | 1/2008 |
| JP | 2011527854 A | 11/2011 |
| JP | 2012504378 A | 2/2012 |
| JP | 2013503566 A | 1/2013 |
| JP | 2013515435 A | 5/2013 |
| JP | 2013526119 A | 6/2013 |
| JP | 2013532443 A | 8/2013 |
| JP | 2014504097 A | 2/2014 |
| KR | 20120023610 A | 3/2012 |
| KR | 20120064088 A | 6/2012 |
| KR | 20120104236 A | 9/2012 |

(56) References Cited

FOREIGN PATENT DOCUMENTS

| | | | |
|---|---|---|---|
| KR | 20140142356 A | 12/2014 |
| WO | 2008117987 A1 | 10/2008 |
| WO | 2010005775 A1 | 1/2010 |
| WO | 2010120692 A1 | 10/2010 |
| WO | 2014011668 A1 | 1/2014 |
| WO | 2014132599 A1 | 9/2014 |
| WO | 2016126578 A1 | 8/2016 |

OTHER PUBLICATIONS

Agilent Technologies, "Wireless LAN at 60 GHZ—IEEE 802.11ad Explained," https://www.cs.odu.edu/~cs752/papers/milli-008.pdf, May 30, 2013, total 28 page, USA.

"Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications," IEEE P802.11aj/D1.0, Nov. 2015, 329 pages.

"IEEE Standard for Information Technology—Telecommunications and Information Exchange Between Systems, Local and Metropolitan Area Networks—Specific Requirements; Part 11: Wireless LAN Medium Access Control (MAC) and Physical Layer (PHY) Specifications," IEEE Computer Society, IEEE Std 802.11ad-2012, Dec. 28, 2012, 628 pages.

Grieve, David, "Annex L update for the Dband", Wireless LANs, IEEE Draft Document 802.11-12/0077r0, Agilent, Jan. 20, 2012, XP017672872, total 36 pages.

Tang, X., et al., "Multiple Binary ZCZ Sequence Sets With Good Cross-Correlation Property Based on Complementary Sequence Sets", IEEE Transactions on Information Theory ( vol. 56, Issue: 8, Aug. 2010), pp. 4038-4045.

Part 11: Wireless LAN Medium Access Control (MAC) and Physical Layer (PHY) Specifications; Amendment 3: Enhancements for Very High Throughput in the 60 GHz Band, IEEE Std 802.11ad.-2012, Dec. 28, 2012, pp.439-478.

Tantawy, Ahmed N., "High Performance Networks, Technology and Protocols," Springer Science+Business Media,LLC, 1994, retrieved from https://books.google.com/books?id=yu4HCAAAQBAJ&pg=PA217&lpg=PA217&dq=header+check+sequence+is+determined&source=bl&ols=eTde7wKPga&sig=t42QtrNjRp5wQXRgyUx-pOSRol8&hl=en&sa=X&ved=0ahUKEwjO1lbJ6lvMAhWlyT4KHR14AZoQ6AEIKTAC#v=onepage&q=header%20check%20sequence%20is%20determined&f=false, downloaded on Jun. 8, 2016, pp. 217-218.

Tantawy A., "High Performance Networks", Technology and Protocols, 4 pages, 1994.

* cited by examiner

| Ga₁₂₈ | | | | | | | | | | | | | | | |
|---|---|---|---|---|---|---|---|---|---|---|---|---|---|---|---|
| +1 | +1 | -1 | -1 | -1 | -1 | -1 | -1 | -1 | +1 | -1 | +1 | +1 | -1 | -1 | +1 |
| +1 | +1 | -1 | -1 | +1 | +1 | +1 | +1 | -1 | +1 | -1 | +1 | -1 | +1 | +1 | -1 |
| -1 | -1 | +1 | +1 | +1 | +1 | +1 | +1 | +1 | -1 | +1 | -1 | -1 | +1 | +1 | -1 |
| +1 | +1 | -1 | -1 | +1 | +1 | +1 | +1 | -1 | +1 | -1 | +1 | -1 | +1 | +1 | -1 |
| +1 | +1 | -1 | -1 | -1 | -1 | -1 | -1 | -1 | +1 | -1 | +1 | +1 | -1 | -1 | +1 |
| +1 | +1 | -1 | -1 | +1 | +1 | +1 | +1 | -1 | +1 | -1 | +1 | -1 | +1 | +1 | -1 |
| +1 | +1 | -1 | -1 | -1 | -1 | -1 | -1 | -1 | +1 | -1 | +1 | +1 | -1 | -1 | +1 |
| -1 | -1 | +1 | +1 | -1 | -1 | -1 | -1 | +1 | -1 | +1 | -1 | +1 | -1 | -1 | +1 |

*Fig. 3A*

| Gb₁₂₈ | | | | | | | | | | | | | | | |
|---|---|---|---|---|---|---|---|---|---|---|---|---|---|---|---|
| -1 | -1 | +1 | +1 | +1 | +1 | +1 | +1 | +1 | -1 | +1 | -1 | -1 | +1 | +1 | -1 |
| -1 | -1 | +1 | +1 | -1 | -1 | -1 | -1 | +1 | -1 | +1 | -1 | +1 | -1 | -1 | +1 |
| +1 | +1 | -1 | -1 | -1 | -1 | -1 | -1 | -1 | +1 | -1 | +1 | +1 | -1 | -1 | +1 |
| -1 | -1 | +1 | +1 | -1 | -1 | -1 | -1 | +1 | -1 | +1 | -1 | +1 | -1 | -1 | +1 |
| +1 | +1 | -1 | -1 | -1 | -1 | -1 | -1 | -1 | +1 | -1 | +1 | +1 | -1 | -1 | +1 |
| +1 | +1 | -1 | -1 | +1 | +1 | +1 | +1 | -1 | +1 | -1 | +1 | -1 | +1 | +1 | -1 |
| +1 | +1 | -1 | -1 | -1 | -1 | -1 | -1 | -1 | +1 | -1 | +1 | +1 | -1 | -1 | +1 |
| -1 | -1 | +1 | +1 | -1 | -1 | -1 | -1 | +1 | -1 | +1 | -1 | +1 | -1 | -1 | +1 |

*Fig. 3B*

$Ga_{128, new, 1}$

$Gb_{128, new, 1}$

| $Ga_{128, new, 2}$ | | | | | | | | | | | | | | | |
|---|---|---|---|---|---|---|---|---|---|---|---|---|---|---|---|
| -1 | +1 | -1 | -1 | +1 | -1 | -1 | -1 | +1 | -1 | +1 | +1 | +1 | -1 | -1 | -1 |
| -1 | +1 | -1 | -1 | +1 | -1 | -1 | -1 | -1 | +1 | -1 | -1 | -1 | +1 | +1 | +1 |
| +1 | -1 | +1 | +1 | -1 | +1 | +1 | +1 | -1 | +1 | -1 | -1 | -1 | +1 | +1 | +1 |
| +1 | -1 | +1 | +1 | -1 | +1 | +1 | +1 | +1 | -1 | +1 | +1 | +1 | -1 | -1 | -1 |
| +1 | -1 | +1 | +1 | -1 | +1 | +1 | +1 | -1 | +1 | -1 | -1 | -1 | +1 | +1 | +1 |
| -1 | +1 | -1 | -1 | +1 | -1 | -1 | -1 | -1 | +1 | -1 | -1 | -1 | +1 | +1 | +1 |
| +1 | -1 | +1 | +1 | -1 | +1 | +1 | +1 | -1 | +1 | -1 | -1 | -1 | +1 | +1 | +1 |
| -1 | +1 | -1 | -1 | +1 | -1 | -1 | -1 | -1 | +1 | -1 | -1 | -1 | +1 | +1 | +1 |

*Fig. 17A*

| $Gb_{128, new, 2}$ | | | | | | | | | | | | | | | |
|---|---|---|---|---|---|---|---|---|---|---|---|---|---|---|---|
| +1 | +1 | +1 | -1 | -1 | -1 | +1 | -1 | -1 | -1 | -1 | +1 | -1 | -1 | +1 | -1 |
| +1 | +1 | +1 | -1 | -1 | -1 | +1 | -1 | +1 | +1 | +1 | -1 | +1 | +1 | -1 | +1 |
| -1 | -1 | -1 | +1 | +1 | +1 | -1 | +1 | +1 | +1 | +1 | -1 | +1 | +1 | -1 | +1 |
| -1 | -1 | -1 | +1 | +1 | +1 | -1 | +1 | -1 | -1 | -1 | +1 | -1 | -1 | +1 | -1 |
| -1 | -1 | -1 | +1 | +1 | +1 | -1 | +1 | +1 | +1 | +1 | -1 | +1 | +1 | -1 | +1 |
| +1 | +1 | +1 | -1 | -1 | -1 | +1 | -1 | +1 | +1 | +1 | -1 | +1 | +1 | -1 | +1 |
| -1 | -1 | -1 | +1 | +1 | +1 | -1 | +1 | +1 | +1 | +1 | -1 | +1 | +1 | -1 | +1 |
| +1 | +1 | +1 | -1 | -1 | -1 | +1 | -1 | +1 | +1 | +1 | -1 | +1 | +1 | -1 | +1 |

METHOD FOR AUTO-DETECTION OF WLAN PACKETS USING STF

This application is a continuation of U.S. application Ser. No. 17/028,592, filed on Sep. 22, 2020, now U.S. Pat. No. 11,637,572 issued on Apr. 25, 2023, and entitled "Method for Auto-Detection of WLAN Packets using STF," which is a divisional of U.S. application Ser. No. 15/043,089, filed on Feb. 12, 2016, now U.S. Pat. No. 10,813,083 issued on Oct. 20, 2020, and entitled "System and Method for Auto-Detection of WLAN Packets using STF," which claims priority to U.S. Provisional Application No. 62/115,445, filed on Feb. 12, 2015, and entitled "Method and Apparatus for Auto-Detection of WLAN Packets,' and U.S. Provisional Application No. 62/219,794, filed on Sep. 17, 2015, and entitled "System and Method for Auto-Detection of 60 GHz WLAN Packets in STF," all of which applications are hereby incorporated by reference herein in their entireties.

TECHNICAL FIELD

The present invention relates generally to wireless networks, and in particular embodiments, to techniques and mechanisms for auto-detection of wireless local area network (WLAN) packets.

BACKGROUND

With the increasing demands of high-definition (HD) displays and other applications, and with the widespread usage of smart phones and tablets, next generation WLANs capable of transmission at higher data rates are needed. IEEE 802.11ad is a WLAN technique that operates in the globally unlicensed 60 GHz band, e.g., 57-66 GHz. Next generation 60 GHz WLANs (NG60), capable of even higher performance than 802.11ad, have been proposed. Although such networks may be capable of higher performance, there is also a need for them to be compatible with current 802.11ad devices.

SUMMARY OF THE INVENTION

Technical advantages are generally achieved by embodiments of this disclosure, which describe auto-detection of WLAN packets.

In accordance with an embodiment, a method is provided. The method includes receiving a wireless packet in a 60 GHz frequency band comprising a short training field (STF), determining a first quantity of cross-correlation peaks between the STF and a first preamble component sequence, and a second quantity of cross-correlation peaks between the STF and a second preamble component sequence, the first quantity being a first threshold or the second quantity being a second threshold for a first packet type, the first quantity being the second threshold or the second quantity being the first threshold for a second packet type, and determining that the wireless packet is the second packet type when the first quantity of cross-correlation peaks equals the second threshold or the second quantity of cross-correlation peaks equals the first threshold.

In some embodiments, the first threshold is forty-eight and the second threshold is sixteen. In some embodiments, the first packet type is an Institute of Electrical and Electronics Engineers (IEEE) 802.11ad packet type, and the second packet type is an IEEE 802.11ay packet type. In some embodiments, the first preamble component sequence is $Ga_{128}$ and the second preamble component sequence is $Gb_{128}$.

In accordance with an embodiment, a method is provided. The method includes transmitting in a 60 GHz frequency band a wireless packet comprising a short training field (STF), a header, a payload, and a training field, the STF producing a first quantity of cross-correlation peaks when correlated with a first preamble component sequence, the STF producing a second quantity of cross-correlation peaks when correlated with a second preamble component sequence, the first quantity being a first threshold or the second quantity being a second threshold for a first packet type, the first quantity being the second threshold or the second quantity being the first threshold for a second packet type.

In some embodiments, the first threshold is forty-eight and the second threshold is sixteen. In some embodiments, the first packet type is an Institute of Electrical and Electronics Engineers (IEEE) 802.11ad packet type, and the second packet type is an IEEE 802.11ay packet type. In some embodiments, the first preamble component sequence is $Gb_{128}$ and the second preamble component sequence is $Ga_{128}$.

In accordance with an embodiment, a method is provided. The method includes receiving a wireless packet in a 60 GHz frequency band comprising a short training field (STF), determining a first quantity of cross-correlation peaks between the STF and a first preamble component sequence, and a second quantity of cross-correlation peaks between the STF and a second preamble component sequence, the first quantity being a first threshold or the second quantity being a second threshold for a first packet type, removing a phase shift from the STF to produce a phase shifted STF, determining a third quantity of cross-correlation peaks between the phase shifted STF and the first preamble component sequence, and a fourth quantity of cross-correlation peaks between the phase shifted STF and the second preamble component sequence, and determining that the wireless packet is a second packet type when the third quantity equals the first threshold or the fourth quantity equals the second threshold.

In some embodiments, the first packet type is an Institute of Electrical and Electronics Engineers (IEEE) 802.11ad packet type, and the second packet type is an IEEE 802.11ay packet type. In some embodiments, removing the phase shift from the STF comprises applying a linear phase rotation other than $$e^{j\pi \frac{n}{2}}$$

to the STF. In some embodiments, removing the phase shift from the STF comprises applying a block rotation to the STF.

In accordance with an embodiment, a method is provided. The method includes adding a phase shift to a short training field (STF) to produce a phase shifted STF, and transmitting in a 60 GHz frequency band a wireless packet comprising the phase shifted STF, a header, a payload, and a training field, the phase shifted STF producing a first quantity of cross-correlation peaks when correlated with a first preamble component sequence and a second quantity of cross-correlation peaks when correlated with a second preamble component sequence, the phase shifted STF producing a third quantity of cross-correlation peaks when correlated with the first preamble component sequence and a fourth quantity of cross-correlation peaks when correlated with the second preamble component sequence after the phase shift is removed from the phase shifted STF, the first quantity being a first threshold or the second quantity being a second threshold for a first packet type, the third quantity being the first threshold or the fourth quantity being the second threshold for a second packet type.

In some embodiments, the first packet type is an Institute of Electrical and Electronics Engineers (IEEE) 802.11ad packet type, and the second packet type is an IEEE 802.11ay packet type. In some embodiments, adding the phase shift to the STF comprises applying a linear phase rotation other than $$e^{j\pi\frac{n}{2}}$$

to the STF. In some embodiments, adding the phase shift to the STF comprises applying a block rotation to the STF.

In accordance with an embodiment, a method is provided. The method includes receiving a wireless packet comprising a short training field (STF), determining cross-correlations between the STF and a first preamble component sequence from a first set of preamble component sequences associated with a first packet type and between the STF and a second preamble component sequence from a second set of preamble component sequences associated with a second packet type, the first preamble component sequence and the second preamble component sequence having a zero correlation zone (ZCZ) property, and determining that the wireless packet is the second packet type when there is a greater correlation between the STF and the second preamble component sequence than between the STF and the first preamble component sequence.

In some embodiments, the first packet type is an Institute of Electrical and Electronics Engineers (IEEE) 802.11ad packet type, and the second packet type is an IEEE 802.11ay packet type. In some embodiments, the ZCZ property is a ZCZ of at least 64 symbol time slots in width. In some embodiments, the first set of preamble component sequences comprise preamble component sequences $Ga_{128}$ and $Gb_{128}$. In some embodiments, the second set of preamble component sequences comprise preamble component sequences $Ga_{128,new,1}$ and $Gb_{128,new,1}$. In some embodiments, the second set of preamble component sequences comprise mutual ZCZ sequences. In some embodiments, the mutual ZCZ sequences comprise preamble component sequences $Ga_{128,new,2}$ and $Gb_{128,new,2}$. In some embodiments, the second set of preamble component sequences comprise quadrature phase shift keying (QPSK) modulated preamble component sequences. In some embodiments, the QPSK modulated preamble component sequences comprise preamble component sequences $A_{128}$ and $B_{128}$.

In accordance with an embodiment, a method is provided. The method includes selecting a first Golay sequence from a first pair of Golay complementary sequences associated with first packet type, each Golay sequence of the first pair of Golay complementary sequences being zero correlation zone (ZCZ) sequences with each Golay sequence of a second pair of Golay complementary sequences associated with a second packet type, and transmitting a wireless packet carrying a short training field (STF) that includes one or more instances of the first Golay sequence.

In some embodiments, the first pair of Golay complementary sequences comprise preamble component sequences $Ga_{128,new,1}$ and $Gb_{128,new,1}$ In some embodiments, the first pair of Golay complementary sequences comprise mutual ZCZ sequences. In some embodiments, the mutual ZCZ sequences comprise preamble component sequences $Ga_{128,new,2}$ and $Gb_{128,new,2}$. In some embodiments, the first pair of Golay complementary sequences comprise quadrature phase shift keying (QPSK) modulated Golay complementary sequences. In some embodiments, the QPSK modulated Golay complementary sequences comprise preamble component sequences $A_{128}$ and $B_{128}$. In some embodiments, transmitting the wireless packet comprises transmitting a real portion of the QPSK modulated Golay complementary sequences on a first antenna and transmitting an imaginary portion of the QPSK modulated Golay complementary sequences on a second antenna.

BRIEF DESCRIPTION OF THE DRAWINGS

For a more complete understanding of the present invention, and the advantages thereof, reference is now made to the following description taken in conjunction with the accompanying drawings, in which:

FIGS. 3A and 3B show preamble component sequences for PHY packets;

FIGS. 12A-16B illustrate a third auto-detection scheme using STFs;

FIGS. 17A-21B illustrate a fourth auto-detection scheme using STFs;

FIGS. 22A-25B illustrate a fifth auto-detection scheme using STFs;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
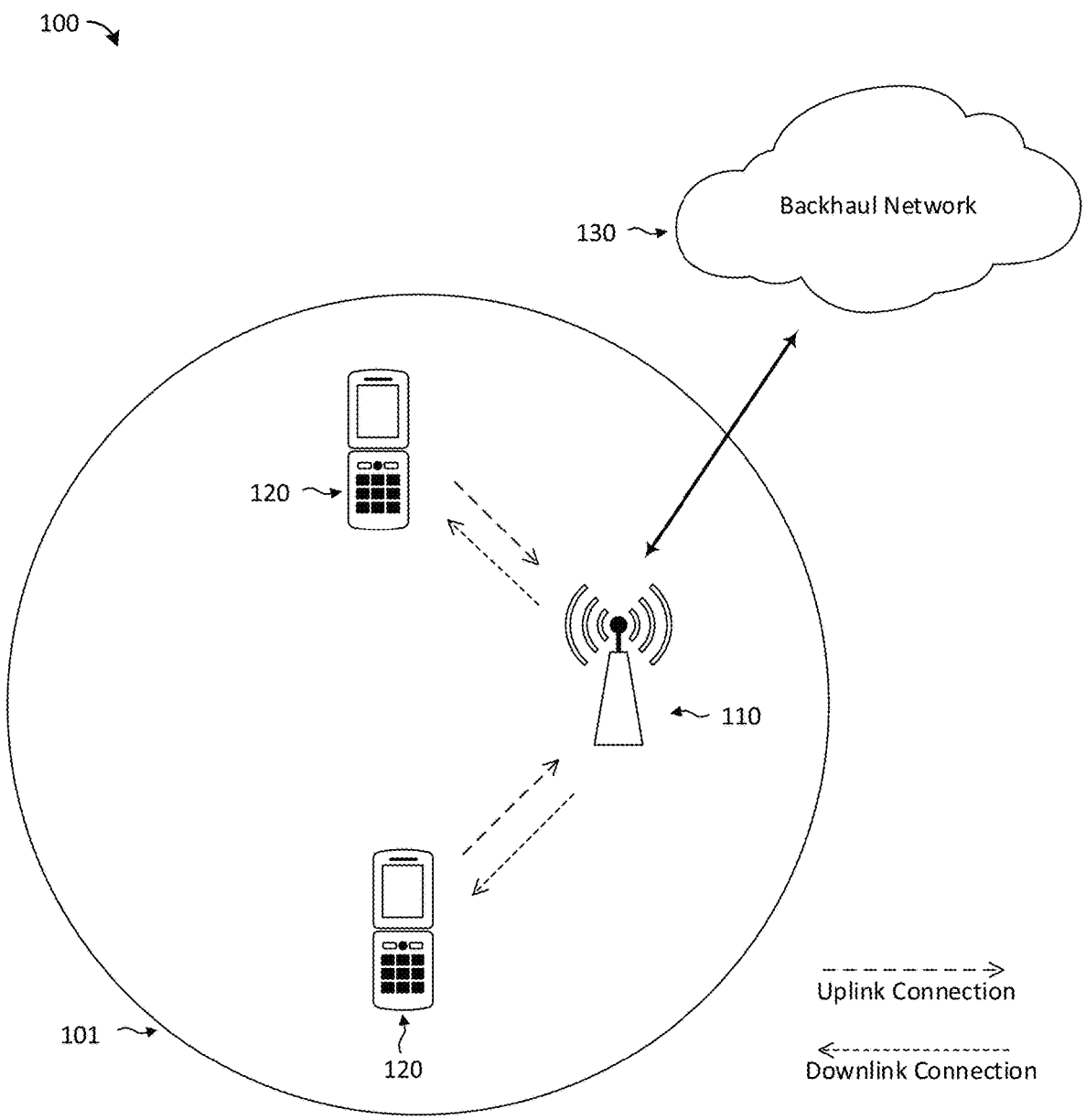
FIG. 1 is a diagram of an embodiment wireless communications network.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

IEEE 802.11ay is currently being developed as an NG60 extension to IEEE 802.11ad, with a goal of achieving extended throughput and range. Disclosed herein is a system and method for using short training fields to determine whether a received wireless physical (PHY) packet is an IEEE 802.11ay control packet, an IEEE 802.11ay non-control packet, an IEEE 802.11ad control packet, or an IEEE 802.11ad non-control packet.

In particular, STF fields in IEEE 802.11ay packets may be different from STF fields in IEEE 802.11ad packets such that a different numbers of cross-correlation peaks result when the respective STFs are cross-correlated with one or more preamble component sequences. As a result, an IEEE 802.11ay receiver may be able to distinguish IEEE 802.11ay packets from IEEE 802.11ad packets by performing cross-correlation. For example, the IEEE 802.11ay receiver may determine a number of cross-correlation peaks between an STF in a packet and a first preamble component sequence, and a number of cross-correlation peaks between the STF in the packet and a second preamble component sequence. The first preamble component sequence and the second preamble component sequence may be complementary sequences that have an out-of-phase aperiodic autocorrelation coefficients sum that is zero. In one embodiment, the first preamble component sequence and the second preamble component sequence may form Golay pairs. The IEEE 802.11ay receiver may then determine whether the packet is an IEEE 802.11ay packet or an IEEE 802.11ad packet based on the numbers of correlation peaks between the STF in the packet and the first and second pairs of preamble component sequences. The IEEE 802.11ay receiver may determine that the packet is an IEEE 802.11ad packet when a number of cross-correlation peaks between the STF in the packet and the first preamble component sequence exceeds a first threshold (e.g., 16 peaks) or when a number of cross-correlation peaks between the STF in the packet and the second preamble component sequence exceeds a second threshold (e.g., 48 peaks). The IEEE 802.11ay receiver may determine that the packet is an IEEE 802.11ay packet when a number of cross-correlation peaks between the STF in the packet and the second preamble component sequence exceeds a first threshold (e.g., 16 peaks) or when a number of cross-correlation peaks between the STF in the packet and the first preamble sequence exceeds a second threshold (e.g., 48 peaks). Because embodiment 802.11ay packets can be distinguished from 802.11ad packets, 802.11ad receivers may discard 802.11ay packets, rather than continuing to process incompatible packets, which may reduce power consumption at the 802.11ad receivers. Such savings may be accomplished without reprogramming existing 802.11ad receivers, because such receivers already work in a way that allows them to discard embodiment 802.11ay packets.

Other techniques for distinguishing IEEE 802.11ay packets from IEEE 802.11ad packets are disclosed. In some embodiments, IEEE 802.11ay packets are transmitted using preamble component sequences that are phase-rotated variants of the preamble component sequences used to transmit IEEE 802.11ad packets. As a result, an IEEE 802.11ay receiver may be able to distinguish IEEE 802.11ay packets from IEEE 802.11ad packets by determining a number of cross-correlation peaks between an STF in a packet and a pair of preamble component sequences, then removing a phase rotation from the STF and determining a number of cross-correlation peaks between the phase-rotated STF and the same pair of preamble component sequences. The IEEE 802.11ay receiver may then determine whether the packet is an IEEE 802.11ay packet or an IEEE 802.11ad packet according to whether the STF or the phase-rotated STF has a higher degree of cross-correlation with the preamble component sequences.

In some embodiments, preamble component sequences are selected for the STFs of control and non-control 802.11ay packets such that these preamble component sequences for 802.11ay are mutual zero correlation zone (ZCZ) sequences with respective preamble component sequences for 802.11ad. Preamble component sequences are sequences of symbols transmitted in the preamble (e.g., STF, CEF) of a frame that are known to a receiver and transmitter. The preamble component sequences in IEEE 802.11ad and 802.11ay are Golay complimentary sequences. In some embodiments, preamble component sequences are selected for the STFs of control and non-control packets in an 802.11ay packet such that these preamble component sequences are mutual zero correlation zone (ZCZ) sequences with a zero correlation zone in a range of about 65 time-domain symbol spacings. In some embodiments, the preamble component sequences for control and non-control 802.11ay packets are QPSK-modulated for use in 802.11ay packets.

Various embodiments may achieve advantages. By performing auto-detection in the STF, CEF, and/or header(s), a receiver may identify the format of a received packet at an early stage of reception. In particular, auto-detection can be performed very early in the reception pipeline in embodiment Physical Layer Convergence Protocol (PLCP) Protocol Data Units (PPDUs) that receive the STF before the CEF, header, or data fields. Additionally, proper selection of the STF and/or CEF of an 802.11ay packet may permit legacy 802.11ad devices to detect the length and modulation coding scheme (MCS) of 802.11ay packets, which may reduce ambiguity during auto-detection.

FIG. 1 is a diagram of a network 100 for communicating data. The network 100 comprises an access point (AP) 110 having a coverage area 101, a plurality of mobile devices 120, and a backhaul network 130. As shown, the AP 110 establishes uplink (dashed line) and/or downlink (dotted line) connections with the mobile devices 120, which serve to carry data from the mobile devices 120 to the AP 110 and vice-versa. Data carried over the uplink/downlink connections may include data communicated between the mobile devices 120, as well as data communicated to/from a remote-end (not shown) by way of the backhaul network 130. As used herein, the term "access point" refers to any component (or collection of components) configured to provide wireless access in a network, such as an evolved NodeB (eNB), a macro-cell, a femtocell, a Wi-Fi AP, or other wirelessly enabled devices. APs may provide wireless access in accordance with one or more wireless communication protocols, e.g., Long Term Evolution (LTE), LTE advanced (LTE-A), High Speed Packet Access (HSPA), Wi-Fi 802.11a/b/g/n/ac, etc. As used herein, the term "mobile device" refers to any component (or collection of components) capable of establishing a wireless connection with an access point, such as a user equipment (UE), a mobile station (STA), and other wirelessly enabled devices. In some embodiments, the network 100 may comprise various other wireless devices, such as relays, low power nodes, etc. Embodiment techniques may be performed on a receiver in the network 100, such as the AP 110.

PPDUs are units of data transmitted over the physical (PHY) layer of a network, e.g., Layer 1 of the Open Systems Interconnection (OSI) model. PPDUs are structured data units that include information such as address information, protocol-control information, and/or user data. The packet structure of a PPDU typically includes a short training field (STF), channel estimation field (CEF), header field, and data payload. Some PPDUs may also include a legacy header field (L-Header) and an NG60 header (N-Header) field. Auto-detection may be performed by detecting the preamble of an 802.11ad PPDU, such as the STF and CEF, and/or the header(s). In particular, the STF and CEF in 802.11ad use structured bipolar-based complementary Golay sequences, which have several beneficial correlation properties that may be leverage by APs to enable auto-detection for 802.11ay networks.

Figure 2:
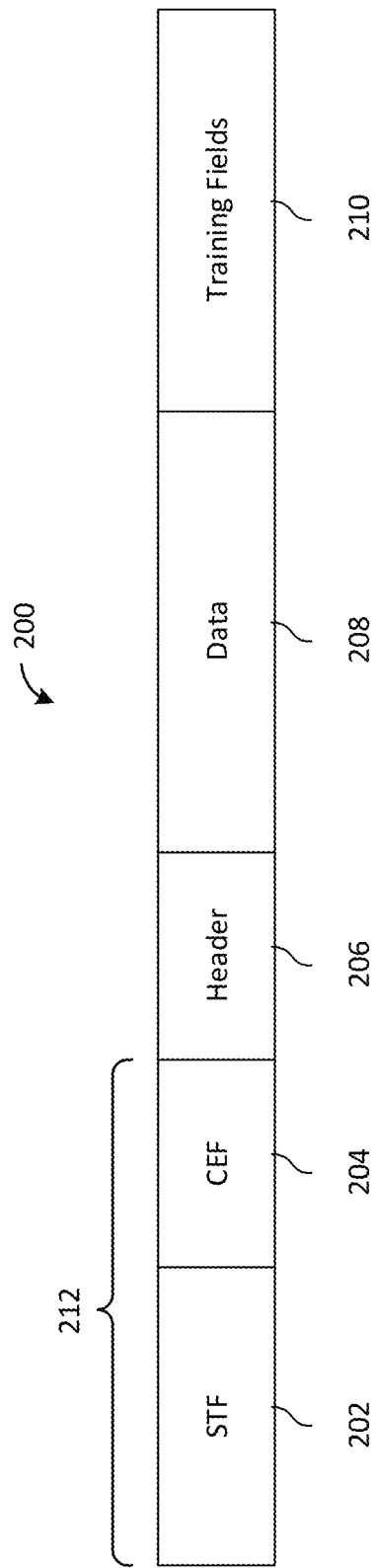
FIG. 2 is a diagram of a packet.

FIG. 2 is a diagram of a packet 200. The packet 200 may be a wireless PHY packet, and may be a control or non-control packet. Control PHY packets typically carry control information in their payloads, and non-control PHY packets typically carry data in their payloads. Non-control PHY packets may be transmitted using various waveforms, such as single carrier (SC) waveforms and orthogonal frequency-division multiplexed (OFDM) waveforms. A receiver may need to determine whether the packet 200 is a non-control or control PHY packet upon receiving the packet 200. The receiver may also need to determine whether the packet 200 is an 802.11ad or an 802.11ay packet.

The packet 200 includes a STF 202, a CEF 204, a header 206, a payload 208, and training fields 210. It should be appreciated that the packet 200 could include other fields. The STF 202 and the CEF 204 are commonly referred to in combination as a packet preamble 212. In some embodiments, the STF 202 is used to determine whether the packet 200 is a control or non-control PHY packet, and whether the packet is an 802.11ad or an 802.11ay PHY packet.

The CEF 204 is used for channel estimation. If the packet 200 is a non-control packet, then the CEF 204 may also allow the receiver to determine what kind of waveform was used to communicate the packet 200, e.g., an SC waveform or an OFDM waveform.

The header 206 may contain indicators or parameters that allow the receiver to decode the payload 208. In some embodiments, the header 206 may be used to determine whether the packet is an 802.11ad PHY packet or an 802.11ay PHY packet.

The payload 208 contains information (e.g., data) carried by the packet 200. The training fields 210 may include other fields such as automatic gain control (AGC) and training (TRN) R/T subfields appended to the packet 200.

FIGS. 3A and 3B show preamble component sequences for PHY packets. The preamble component sequences are bipolar-based Golay complementary sequences having a length of 128 symbols. The preamble component sequences shown in FIG. 3A-B are referred to by IEEE 802.11ad as $Ga_{128}$ and $Gb_{128}$, respectively. The sequences $Ga_{128}$ and $Gb_{128}$ are Golay sequences that form a complementary pair, and the subscript indicates the sequence length of 128. The preamble component sequences $Ga_{128}$ and $Gb_{128}$ may be binary phase-shift keyed (BPSK), such that they are located at 0° and 180° on the unit circle, e.g., each symbol has a modulated value of either 1 or −1. The preamble component sequences $Ga_{128}$ and $Gb_{128}$ may be transmitted in the STF of a PHY packet, such as the STF 202 of packet 200.

Figure 4A:
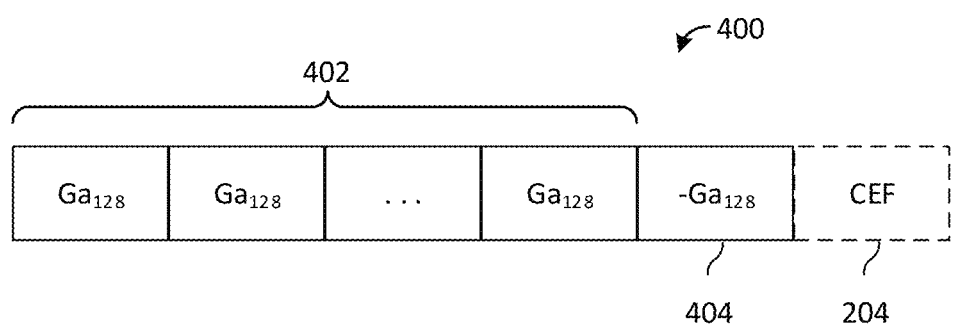
FIGS. 4A and 4B are diagrams of a non-control STF and a control STF.
Figure 4B:

FIGS. 4A and 4B are diagrams of a non-control STF 400 and a control STF 450, respectively, which are included in an 802.11ad packet preamble. The non-control STF 400 and the control STF 450 each include repeated sequences 402, 452 and a termination sequence 404, 454. The control STF 450 further includes a prefix sequence 456 after the termination sequence 454.

The repeated sequences 402, 452 are multiple repetitions of the preamble component sequences $Ga_{128}$ or $Gb_{128}$. The type and quantities of sequences in the repeated sequences 402, 452 may be different between the non-control STF 400 and a control STF 450 so that a receiver may distinguish a non-control 802.11ad PHY packet from a control 802.11ad PHY packet. For example, the repeated sequence 402 may be 16 repetitions of the preamble component sequence $Ga_{128}$, and the repeated sequence 452 may be 48 repetitions of the preamble component sequence $Gb_{128}$.

The termination sequences 404, 454 occur at the end of the repetition portion of the non-control STF 400 and the control STF 450, respectively, and thus mark the end of the non-control STF 400 and the control STF 450. As discussed above, an STF may include different values and have different lengths for a non-control or control PHY packet. As such, the termination sequences 404, 454 are predetermined sequences that indicate the end of an STF. The termination sequences 404, 454 are negative instances of the preamble component sequence used in the repeated sequence 402, 452, e.g., where each symbol in the termination sequences 404, 454 is multiplied by −1. For example, when the repeated sequence 452 is several repetitions of the preamble component sequence $Gb_{128}$, then the termination sequence 454 is a negated preamble component sequence $-Gb_{128}$. Accordingly, the preamble component sequences -Gam and $-Gb_{128}$ may be chosen, respectively, for the termination sequences 404, 454.

The prefix sequence 456 occurs after the termination sequence 454 in the control STF 450. The prefix sequence 456 is a preamble component sequence $-Ga_{128}$ and is used as the cyclic prefix for the CEF 204. The termination sequence 404 of the non-control STF 400 also functions as a prefix sequence for the CEF 204, because the termination sequence 404 is also the preamble component sequence $-Ga_{128}$.

Figure 5A:
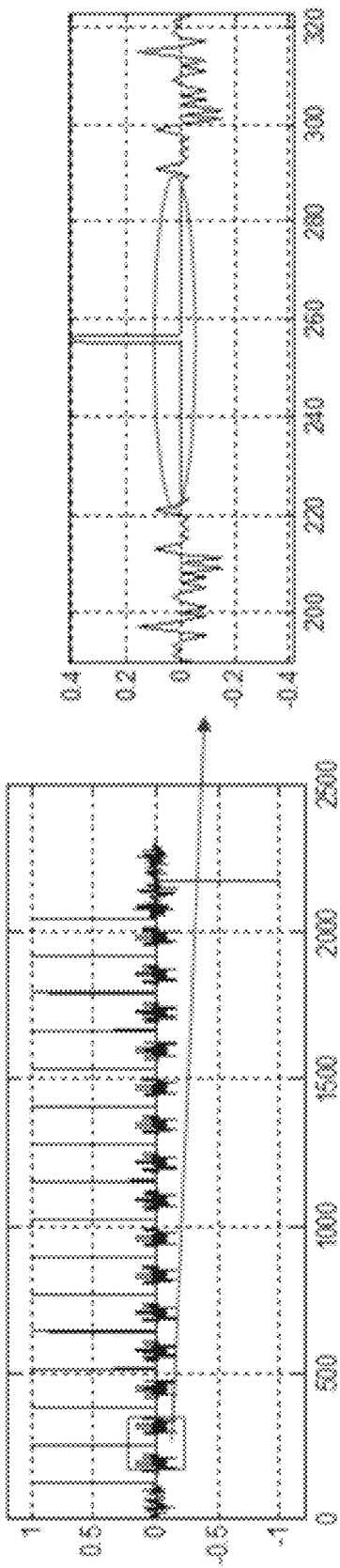
FIGS. 5A-5D are diagrams of correlation properties of STFs with various preamble component sequences.
Figure 5B:
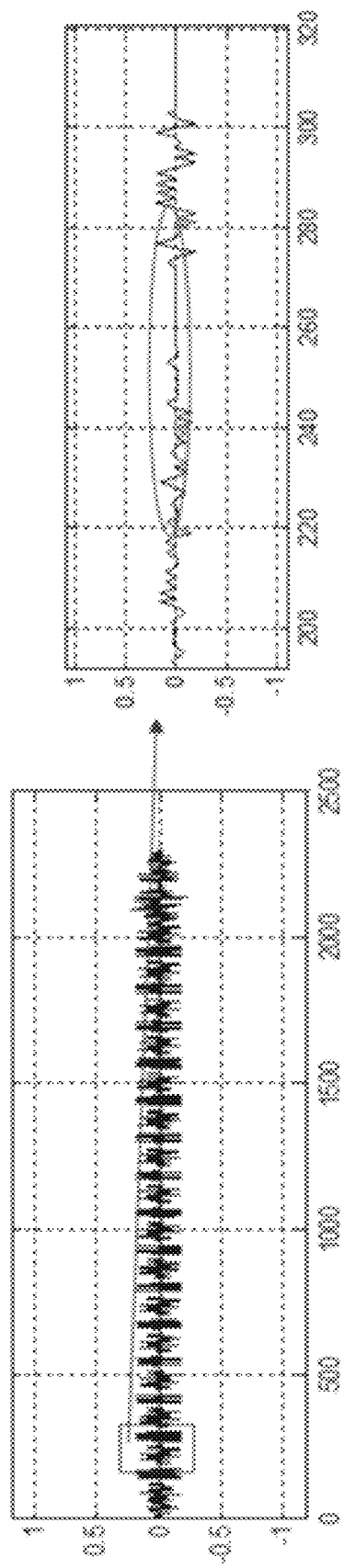

FIGS. 5A and 5B are diagrams of correlation properties of the non-control STF 400 and the control STF 450 with the preamble component sequences $Ga_{128}$ and $Gb_{28}$, respectively. A receiver may perform cross-correlation to determine whether a received sequence matches a known sequence. For example, a receiver may cross-correlate a received STF with the preamble component sequences $Ga_{128}$ and $Gb_{128}$ to determine which preamble component sequence is carried within the STF.

As shown in FIG. 5A, when the non-control STF 400 is correlated with the preamble component sequence $Ga_{128}$, 16 positive impulses and a negative impulse are generated. The 16 positive impulses correspond to correlation peaks with the 16 positive repetitions of the preamble component sequence $Ga_{128}$ in the repeated sequence 402, and the negative impulse corresponds to correlation peaks with the negative instance of the preamble component sequence $Ga_{128}$ in the termination sequence 406. The produced impulses are normalized to have a unit maximum magnitude, e.g., a maximum magnitude of 1 or −1. As shown in FIG. 5B, when the non-control STF 400 is correlated with the preamble component sequence $Gb_{128}$, no correlation peaks are generated. Some noise may be generated, but the magnitude of the noise may not be large enough to register as a correlation peak. As shown in FIGS. 5A and 5B, while the magnitude of the noise is low, there is still an appreciable amount of noise present even when no correlation peak is generated. Accordingly, by cross-correlating an STF in a received packet with both of the preamble component sequences $Ga_{128}$ and $Gb_{128}$, a receiver may be able to determine whether or not the packet is a non-control 802.11ad packet.

Figure 5C:
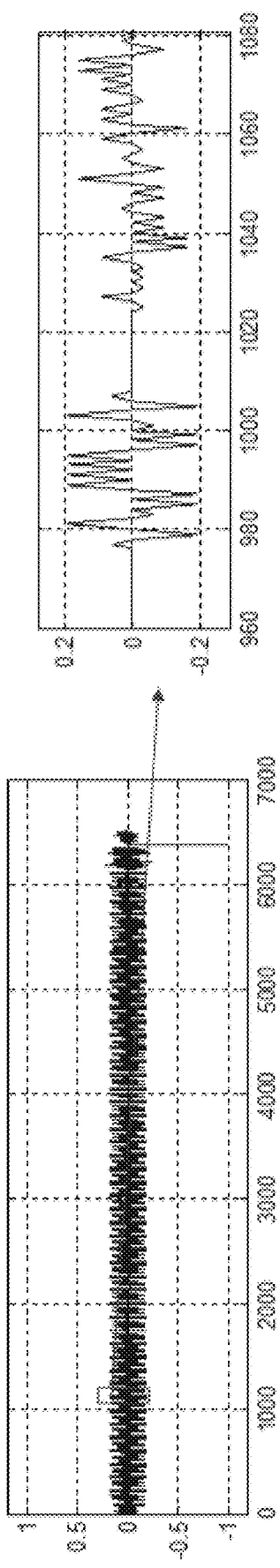
Figure 5D:
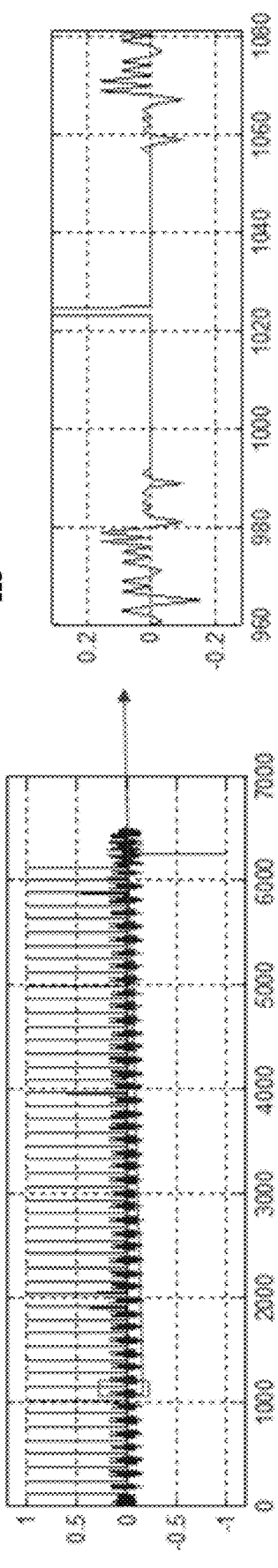

FIGS. 5C and 5D are diagrams of correlation properties of the control STF 450 with the preamble component sequences $Ga_{128}$ and $Gb_{128}$, respectively. As shown in FIG. 5C, when the control STF 450 is correlated with the preamble component sequence $Ga_{128}$, one negative cross-correlation peak is generated. This is because, as shown above, the control STF 450 contains one negative instance of the preamble component sequence $Ga_{128}$. When the control STF 450 is correlated with the preamble component sequence $Gb_{128}$, 48 positive impulses and a negative impulse are generated. These impulses correspond to the 48 positive repetitions of the preamble component sequence $Gb_{128}$ in the repeated sequence 452 and the one negative instance of the preamble component sequence $Gb_{128}$ in the prefix sequence 456. Accordingly, by cross-correlating an STF in a received packet with both of the preamble component sequences $Ga_{128}$ and $Gb_{128}$, a receiver may be able to determine whether or not the packet is an 802.11ad control packet.

Embodiment receivers may also auto-detect receipt of an 802.11ay packet using the STF field. Accordingly, in some embodiments, STFs for 802.11ay packets may be selected such that they are different from STFs for 802.11ad packets. Embodiment receivers may then perform auto-detection of WLAN packets using the STF of received PHY packets. 802.11ay packets may be distinguished from 802.11ad packets using auto-detection schemes, according to autocorrelation and cross-correlation properties of the STFs with various preamble component sequences.

FIGS. 6A-8B illustrate a first auto-detection scheme using STFs in which the preamble component sequences $Ga_{128}$ and $Gb_{128}$, which are used in 802.11ad STFs, may also be used in 802.11ay STFs. In order to distinguish 802.11ay packets from 802.11ad packets, the preamble component sequences $Ga_{128}$ and $Gb_{128}$ may be interchanged between control and non-control STFs in 802.11ay such that $Ga_{128}$ is used for the repeated sequences in an 802.11ay control packet and $Gb_{128}$ is used for the repeated sequences in an 802.11ay non-control packet.

Figure 6A:
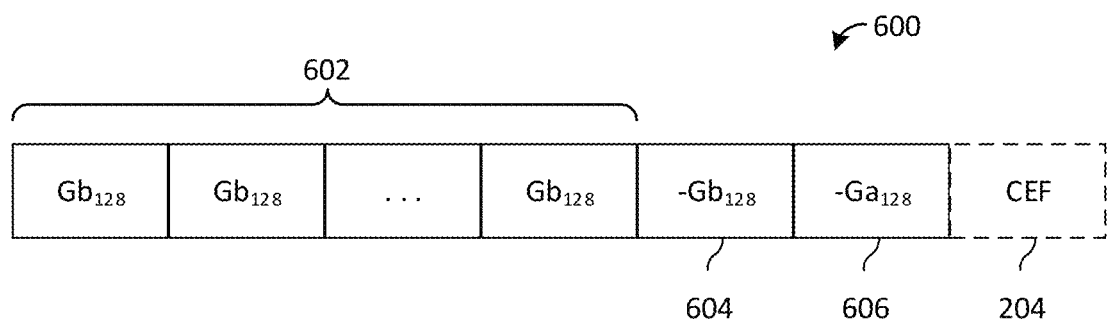
FIGS. 6A-8B illustrate a first auto-detection scheme using STFs.
Figure 6B:
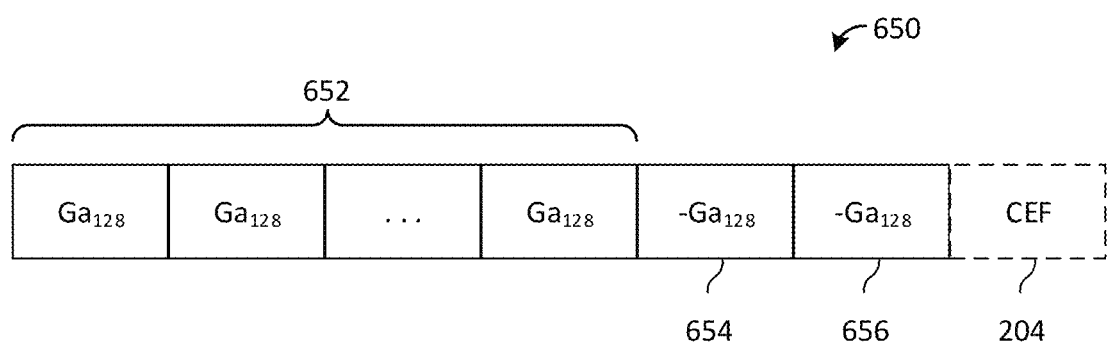

FIGS. 6A and 6B are diagrams of a non-control STF 600 and a control STF 650, respectively, which are included in an 802.11ay packet preamble. The non-control STF 600 and the control STF 650 each include repeated sequences 602, 652, a termination sequence 604, 654, and a prefix sequence 606, 656.

The repeated sequence 602 of the non-control STF 600 includes 16 repetitions of the preamble component sequence $Gb_{128}$, and the control STF 650 includes 48 repetitions of the preamble component sequence $Ga_{128}$. The termination sequence 604, 654 in each STF includes a negative instance of the preamble component sequence used in the repeated sequences 602, 652, i.e., the sequence 604 has one repetition of $-Gb_{128}$, and the sequence 654 has one repetition of $-Ga_{128}$.

In some embodiments, the prefix sequence 606, 656 is a predefined sequence, such as $-Ga_{128}$, used above in the non-control STF 400 and the control STF 450. Adding a single repetition of $-Ga_{128}$ to the control STF 650 may assist in degrading channel estimation for an 802.11ad receiver that receives an 802.11ay PHY packet. An 802.11ad receiver may incorrectly identify a received control STF 650 as a non-control STF after detecting the repeated sequences 652 and the termination sequence 654. Adding a second repetition of $-Ga_{128}$ after the termination sequence 654 prevents the 802.11ad receiver from successfully detecting the CEF 204.

Figure 7A:
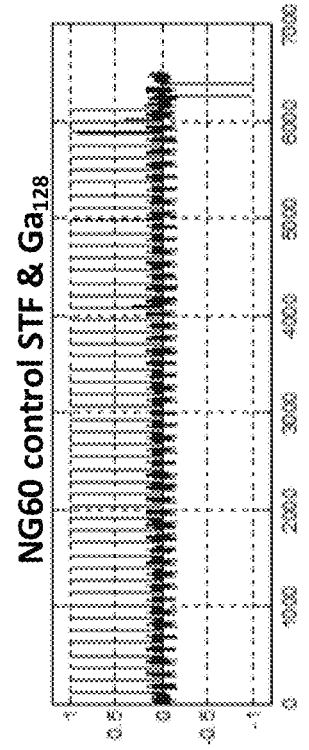
Figure 7B:
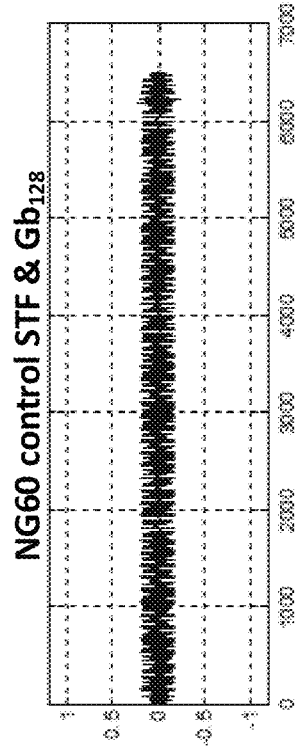
Figure 7C:
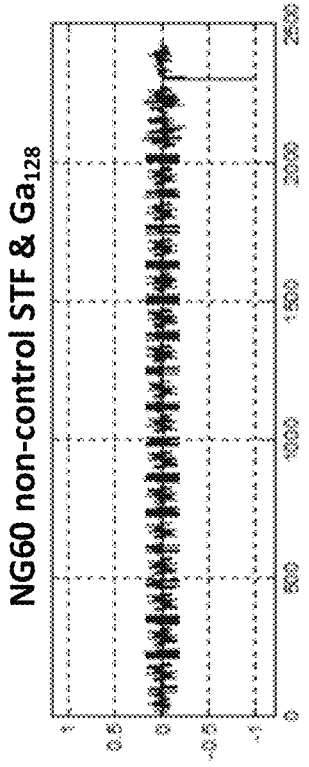
Figure 7D:
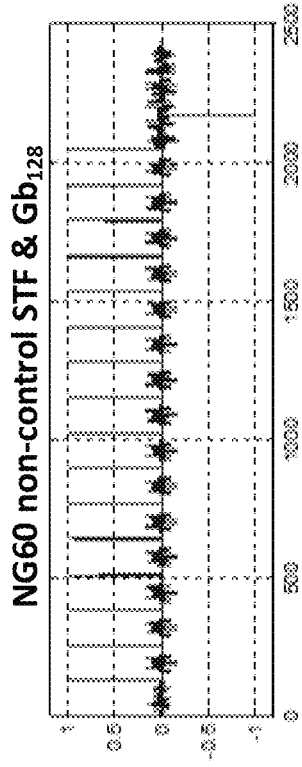

FIGS. 7A-7D are diagrams of cross-correlation properties for the non-control STF 600 and the control STF 650 with the preamble component sequences $Gb_{128}$ and $Ga_{128}$. FIG. 7A is a diagram of cross-correlation properties of the non-control STF 600 with the preamble component sequence $Ga_{128}$. FIG. 7B is a diagram of cross-correlation properties of the non-control STF 600 with the preamble component sequence $Gb_{128}$. FIG. 7C is a diagram of cross-correlation properties of the control STF 650 with the preamble component sequence $Ga_{128}$. FIG. 7D is a diagram of cross-correlation properties of the control STF 650 with the preamble component sequence $Gb_{128}$.

As shown in FIGS. 7A-7D and FIGS. 5A-5D, a relationship exists between the PHY packet type of a received STF, and a number of peaks generated when the received STF is cross-correlated with different preamble component sequences. This relationship can be expressed as a lookup table, as shown below in Table 1.

TABLE 1

| Preamble Seq. | Qty. Peaks | Result | Reference |
|---|---|---|---|
| $Ga_{128}$ | 16 | 802.11ad; non-control | FIG. 5A |
| $Gb_{128}$ | 48 | 802.11ad; control | FIG. 5D |
| $Gb_{128}$ | 16 | 802.11ay; non-control | FIG. 7B |
| $Ga_{128}$ | 48 | 802.11ay; control | FIG. 7C |

As shown above in Table 1, a received PHY packet type can be determined by cross-correlating the STF with the preamble component sequences $Ga_{128}$ and $Gb_{128}$ and counting the number of positive peaks in the correlation result. Also included in Table 1 is a reference to the Figure number that shows a typical cross-correlation result for particular packet and frame types.

Figure 8A:
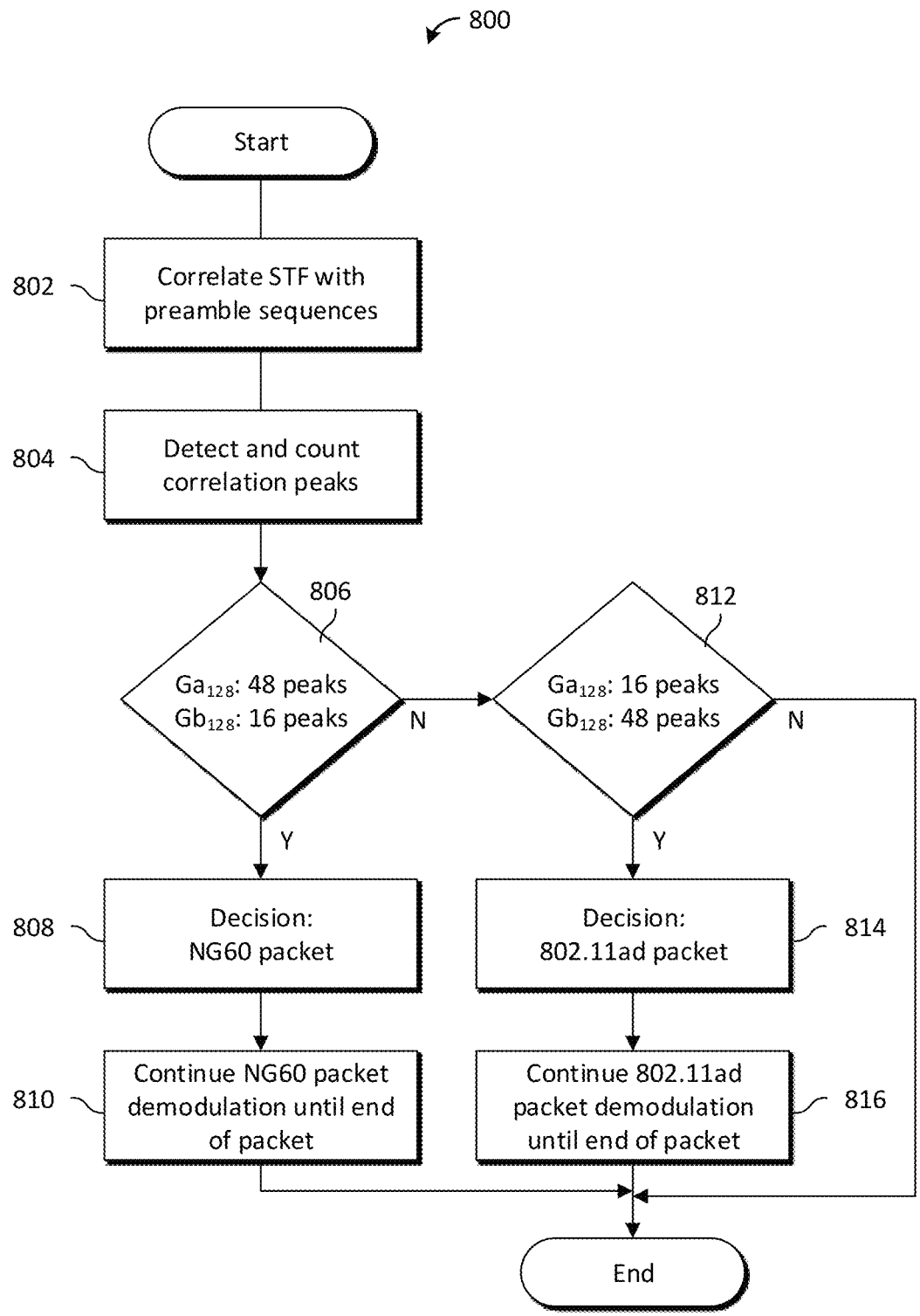

FIG. 8A is a diagram of an embodiment 802.11ay auto-detection method 800. The 802.11ay auto-detection method 800 may be indicative of operations occurring in an 802.11ay receiver when determining the PHY packet type of a received packet using the STF.

The 802.11ay auto-detection method 800 begins by correlating a received STF with the preamble component sequences $Ga_{128}$ and $Gb_{128}$ (step 802). Next, the correlation peaks for each preamble component sequence are detected and counted (step 804). If correlation of the received STF produces about 48 peaks for the preamble component sequence $Ga_{128}$ or about 16 peaks for the preamble component sequence $Gb_{128}$ (step 806), the packet is identified as an 802.11ay packet (step 808). In cases where correlation with one preamble component sequence produces peaks, correlation with the other sequence may produce other values that are not considered peaks, such as noise or zero values. For example, as shown in FIGS. 7C and 7D if 48 peaks are produced when correlated with the preamble component sequence $Ga_{128}$, then those 48 peaks will not be produced when correlated with the preamble component sequence $Gb_{128}$. Next, demodulation and decoding of the packet is continued until the end of the 802.11ay packet (step 810).

If correlation of the STF produces 16 peaks for the preamble component sequence $Ga_{128}$ or 48 peaks for the preamble component sequence $Gb_{128}$ (step 812), the packet is identified as an 802.11ad packet (step 814). Finally, demodulation and decoding of the packet is continued until the end of the 802.11ad packet (step 816).

Figure 8B:
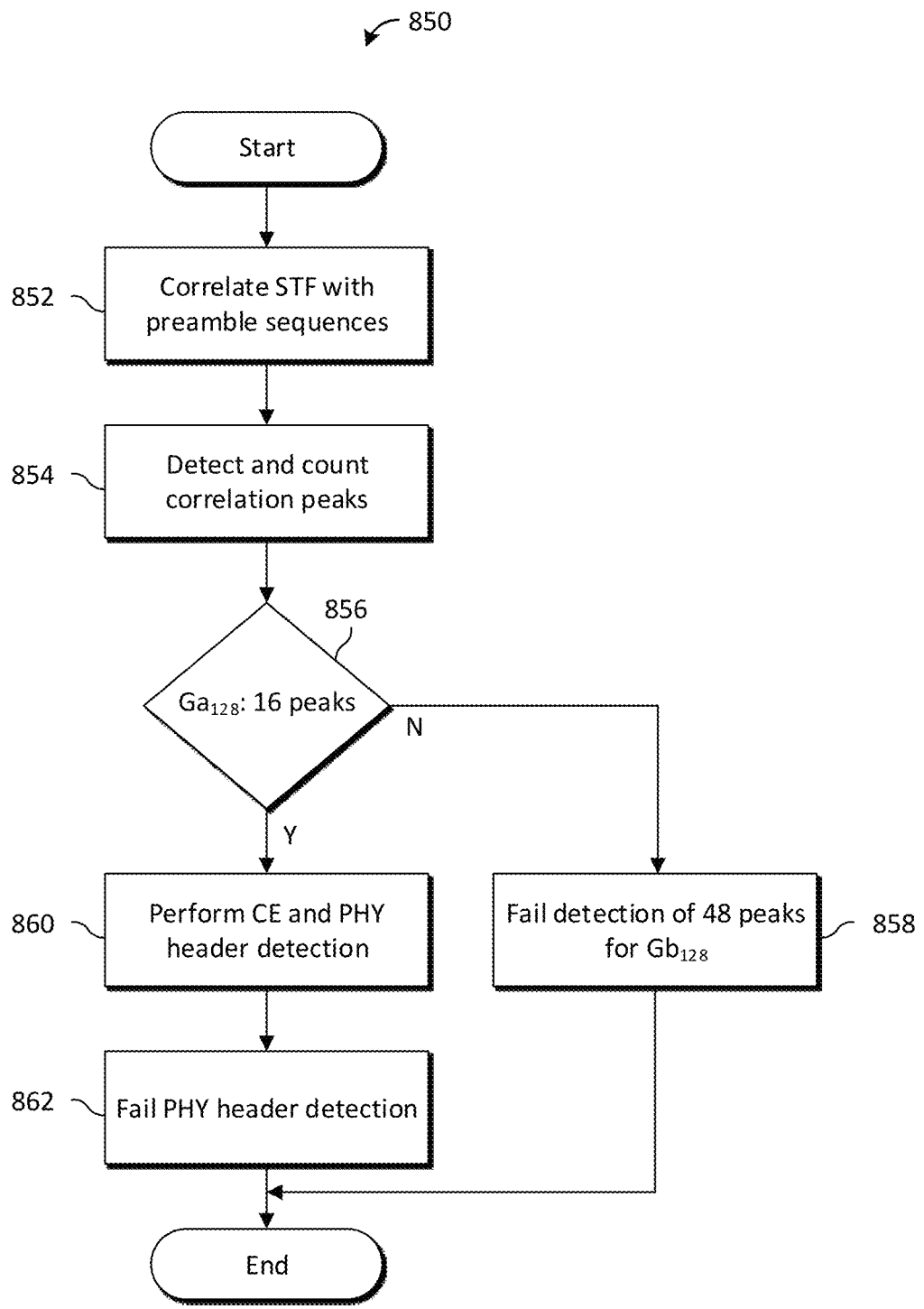

FIG. 8B is a diagram of embodiment 802.11ad auto-detection method 850. The 802.11ad auto-detection method 850 may be indicative of operations occurring in an 802.11ad receiver when determining the PHY packet type of a received packet using the STF. Because an 802.11ad receiver may not be capable of detecting 802.11ay packets, the 802.11ad auto-detection method 850 may thus avoid incorrectly identifying a received 802.11ay packet as a compatible packet for an 802.11ad receiver.

The 802.11ad auto-detection method 850 begins by receiving an 802.11ay STF and correlating it with the preamble component sequences $Ga_{128}$ and $Gb_{128}$ (step 852). Next, the correlation peaks for each preamble component sequence are detected and counted (step 854). Next, the receiver determines whether correlation of the STF with the preamble component sequence $Ga_{128}$ produces 16 peaks (step 856). The correlation with $Ga_{128}$ may not produce 16 peaks if, e.g., the STF is the non-control STF 600. In this case, a detection failure will occur when attempting to count the correlation peaks for $Gb_{128}$ (step 858). The detection failure may occur because an 802.11ad receiver expects correlation of a received STF with the preamble component sequence $Gb_{128}$ to produce 48 peaks (for a control STF) or no peaks (for a non-control STF). However, as shown in FIG. 7B, correlation of the non-control STF 600 with the preamble component sequence $Gb_{128}$ produces 16 peaks. Accordingly, an 802.11ad receiver produces a detection failure when attempting to detect the non-control STF 600.

If, instead, correlation of the STF with the preamble component sequence $Ga_{128}$ produces 16 peaks, then the 802.11ad receiver will proceed to perform channel estimation and PHY header detection (step 860). Such a state may occur when the STF is the control STF 650. As shown in FIG. 7C, correlation of the control STF 650 with $Ga_{128}$ produces 48 peaks; however, some 802.11ad receivers may detect the first 16 peaks of the 48 correlated peaks and falsely identify the control STF 650 as the non-control STF 400. In this case, detection failure will occur when performing PHY header detection (step 862). When a detection failure for either the PHY header or STF occurs, then the 802.11ad auto-detection method 850 terminates. Accordingly, use of the non-control STF 600 and the control STF 650 in an 802.11ay PHY packet may allow an 802.11ad receiver to detect and discard 802.11ay PHY packets, notwithstanding the fact that an 802.11ad receiver may have no knowledge of the STF layout for 802.11ay packets.

$(r_1, r_2, \ldots r_{2176}) r_n \in \{1,-1\} n=1,2,\ldots, 2176 (r_1 e^{j\Theta_1},$
$r_2 e^{j\Theta_2}, \ldots, r_{2176} e^{j\Theta_{2176}}) \Theta_n \in (0, 2\pi) n=1,$
$2, \ldots, 2176$ FIGS. 9A-11B illustrate a second auto-detection scheme using STFs in which the preamble component sequences $Ga_{128}$ and $Gb_{128}$, which are used in 802.11ad STFs, may be used in 802.11ay STFs. In order to distinguish 802.11ay packets from 802.11ad packets, a phase rotation may be applied to each bipolar symbol of the preamble component sequences $Ga_{128}$ and $Gb_{128}$. The values in the repeated sequence 402 of the non-control STF 400 can be expressed generally as:

$r_n \in \{1,-1\} n=1,2,\ldots, 2176 \theta n \in (0, 2\pi) n=1,2,\ldots,$
$2176$ where and. Thus, when applying a phase rotation to each bipolar symbol, the values in the repeated sequence for an 802.11ay non-control STF may be expressed generally as:

$r_n \in \{1,-1\} n=1,2,\ldots, 2176 \theta_n \in (0, 2\pi) n=1,$
$2, \ldots, 2176$ where and $r_n \in \{1,-1\} n=1,2,\ldots, 2176 \theta n \in (0, 2\pi) n=1,$
$2, \ldots, 2176$ $r_n \in \{1,-1\} n=1,2,\ldots, 2176 \theta n \in (0, 2\pi) n=1,$
$2, \ldots, 2176$ $(r_1, r_2, \ldots r_{6400}) r_n \in \{1,-1\} n=1,2,\ldots, 6400 (r_1 e^{j\Theta_1},$
$r_2 e^{j\Theta_2}, \ldots, r_{6400} e^{j\Theta_{6400}}) \Theta_n \in (0, 2\pi) n=1,2, \ldots$
$6400$ Likewise, the values in the repeated sequence 452 of the control STF 450 may be expressed generally as:

$r_n \in \{1,-1\} n=1,2,\ldots, 6400 \theta_n \in (0, 2\pi) n=1,$
$2, \ldots, 6400$ where and. Thus, when applying a phase rotation to each bipolar symbol, the values in the repeated sequence for an 802.11ay control STF may be expressed generally as:

$r_n \in \{1, -1\} n = 1, 2, \ldots, 6400 \theta_n \in (0, 2\pi) n = 1, 2, \ldots, 6400$ where $r_n \in \{1, -1\} n = 1, 2, \ldots, 6400 \theta_n \in (0, 2\pi) n = 1, 2, \ldots, 6400$ and $r_n \in \{1, -1\} n = 1, 2, \ldots, 6400 \theta_n \in (0, 2\pi) n = 1, 2, \ldots, 6400.$ $e^{j\pi \frac{n}{2}} r_{STF}(nT_c) =$
$$\begin{cases} Ga_{128} * (n \bmod 128) * e^{j\pi \frac{n}{2}}, n = 0, 1, \ldots, 16*128 - 1 \\ -Ga_{128} * (n \bmod 128) * e^{j\pi \frac{n}{2}}, n = 16*128, \ldots, 18*128 - 1 \end{cases}$$

$r_{STF}(nT_c) =$
$$\begin{cases} Gb_{128} * (n \bmod 128) * e^{j\pi \frac{n}{2}}, n = 0, 1, \ldots, 48*128 - 1 \\ -Gb_{128} * (n \bmod 128) * e^{j\pi \frac{n}{2}}, n = 48*128, \ldots, 49*128 - 1\ e^{j\theta_n} \theta_n \neq \\ \frac{n\pi}{2} e^{jn\varphi} \varphi \neq \frac{\pi}{2} \varphi = -Ga_{128} * (n \bmod 128) * e^{j\pi \frac{n}{2}}, n = 49 * \\ \quad\quad 128, \ldots, 50*128 - 1 \end{cases}$$

$\frac{\pi}{4}, \frac{3\pi}{4}, \frac{\pi}{8}, \frac{3\pi}{8}, \frac{5\pi}{8},$

As discussed above, each symbol in the preamble component sequences $Ga_{128}$ and $Gb_{128}$ has a modulated value of either 1 or −1. Thus each value is linearly phase-rotated on the unit circle by values other than. For example, the values in the repeated sequence 402 of the non-control STF 400 may be expressed generally as:

$e^{j\pi \frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$ Likewise, the values in the repeated sequence 452 of the control STF 450 may be expressed generally as:

$e^{j\pi \frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$ In other words, a different linear phase rotation, may be selected and applied to the preamble component sequences $Ga_{128}$ and $Gb_{128}$, e.g. Accordingly, in some embodiments, a linear phase rotation is used for 802.11ay, where, e.g., etc. A receiver may determine whether a received packet is an 802.11ad or an 802.11ay packet by cross-correlating the STF of the packet with the preamble component sequences $Ga_{128}$ and $Gb_{128}$, and then removing a phase rotation from the STF of the packet and cross-correlating the de-rotated STF with the preamble component sequences $Ga_{128}$ and $Gb_{128}$. The receiver may then determine the packet type according to which STF has a greater correlation with one or both of the preamble component sequences $Ga_{128}$ and $Gb_{128}$, e.g., which STF produces an expected number of peaks.

$e^{j\pi \frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$ -continued $$e^{j\pi\frac{n}{2}}e^{j\theta_n}\theta_n \neq \frac{n\pi}{2}e^{jn\varphi}\varphi \neq \frac{\pi}{2}\varphi = \frac{\pi}{4}, \frac{3\pi}{4}, \frac{\pi}{8}, \frac{3\pi}{8}, \frac{5\pi}{8},$$

Figure 9A:
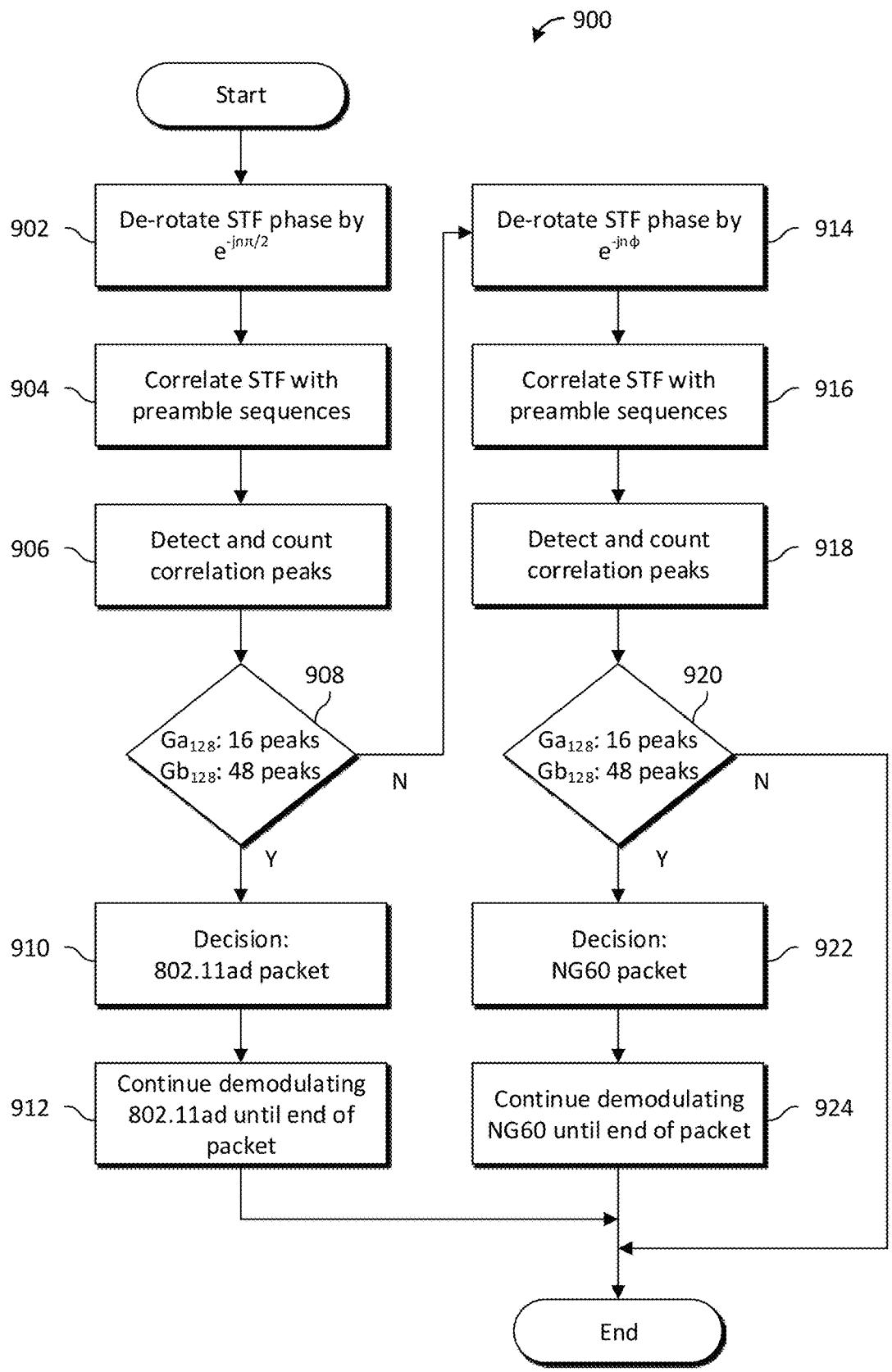
FIGS. 9A-11B illustrate a second auto-detection scheme using STFs.

FIG. 9A is a diagram of an embodiment 802.11ay auto-detection method 900. The 802.11ay auto-detection method 900 may be indicative of operations occurring on an 802.11ay receiver when determining the PHY packet type of a received packet using the STF.

The 802.11ay auto-detection method 900 beings by de-rotating the phase of a received STF by the phase shift used in IEEE 802.11ad, e.g., $$e^{-j\pi\frac{n}{2}}$$

(step 902). Such a de-rotation may be done to first determine whether the received STF is a BPSK-modulated symbol, e.g., an 802.11ad PHY STF. Next, the de-rotated STF is correlated with the preamble component sequences Ga$_{128}$ and Gb$_{128}$ (step 904). Next, the correlation peaks for each preamble component sequence are detected and counted (step 906). If correlation of the received STF produces 16 peaks for the preamble component sequence Ga$_{128}$ or 48 peaks for the preamble component sequence Gb$_{128}$ (step 908), the packet is identified as an 802.11ad packet (step 910). Demodulation and decoding of the packet is continued until the end of the 802.11ad packet (step 912).

If correlation of the received STF does not produce 16 peaks for the preamble component sequence Ga$_{128}$ or 48 peaks for the preamble component sequence Gb$_{128}$, then the phase of the received STF is instead de-rotated by the phase shift used in IEEE 802.11ay, e.g., $e^{-j\pi\varphi}$ (step 914), where $$\varphi \neq \frac{\pi}{2}.$$

Next, the de-rotated STF is correlated with the preamble component sequences Ga$_{128}$ and Gb$_{128}$ (step 916). Next, the correlation peaks for each preamble component sequence are detected and counted (step 918). If correlation of the received STF produces 16 peaks for the preamble component sequence Ga$_{128}$ or 48 peaks for the preamble component sequence Gb$_{128}$ (step 920), the packet is identified as an 802.11ay packet (step 922). Finally, demodulation and decoding of the packet is continued until the end of the 802.11ay packet (step 924).

Figure 9B:
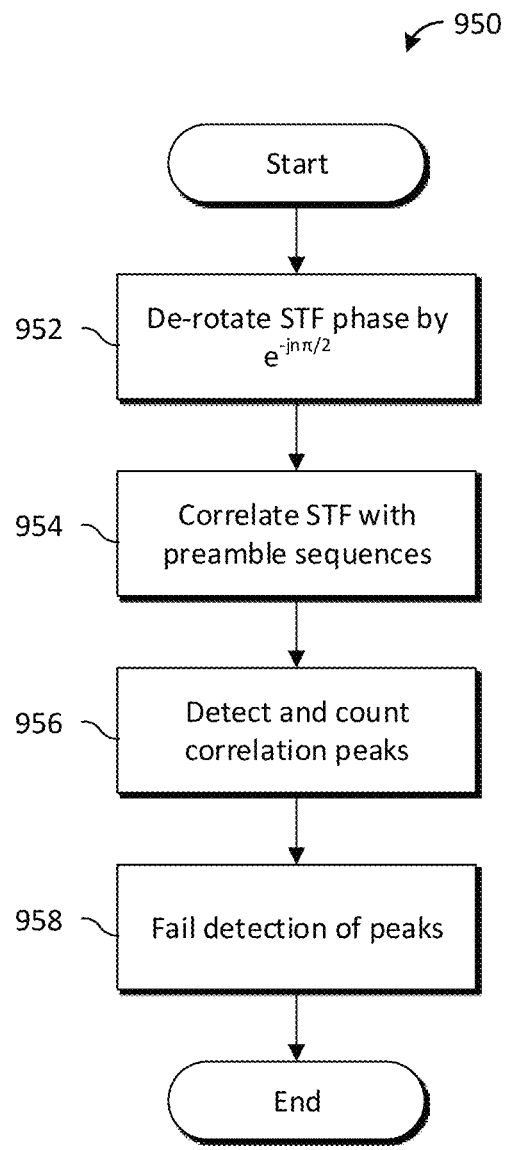

FIG. 9B is a diagram of an embodiment 802.11ad auto-detection method 950. The 802.11ad auto-detection method 950 may be indicative of operations occurring in an 802.11ad receiver.

The 802.11ad auto-detection method 950 begins by de-rotating the phase of a received 802.11ay STF by $$e^{-j\pi\frac{n}{2}}$$

(step 952). The phase is de-rotated by $$e^{-j\pi\frac{n}{2}}$$

because 802.11ad PHY packets contain BPSK-modulated symbols in their STFs, and so an 802.11ad receiver may only be capable of demodulating BPSK-modulated STFs. Next, the received STF is correlated with the preamble component sequences Ga$_{128}$ and Gb$_{128}$ (step 954). Next, an attempt is made to detect and count the correlation peaks for each preamble component sequence (step 956). Finally, a failure occurs when attempting to count the correlation peaks. The failure occurs because the received 802.11ay STF may be modulated with a scheme other than BPSK, e.g., the symbols in the preamble component sequence may be linearly phase-rotated. An 802.11ad receiver may not detect these symbols. Accordingly, embodiment STFs may not interfere with an existing 802.11ad receiver.

In some embodiments, a block phase rotation phase rotation $e^{j\Theta_n}$ may be selected and applied to the preamble component sequences Ga$_{128}$ and Gb$_{128}$ for an 802.11ay STF. That is, each of the preamble component sequences Ga$_{128}$ and Gb$_{128}$ may be block-rotated to produce preamble component sequences Ga$_{128,k}$ and Gb$_{128,k}$, where k is a value from 1 to 17 for non-control STFs, and from 1 to 50 for control STFs.

Figure 10A:
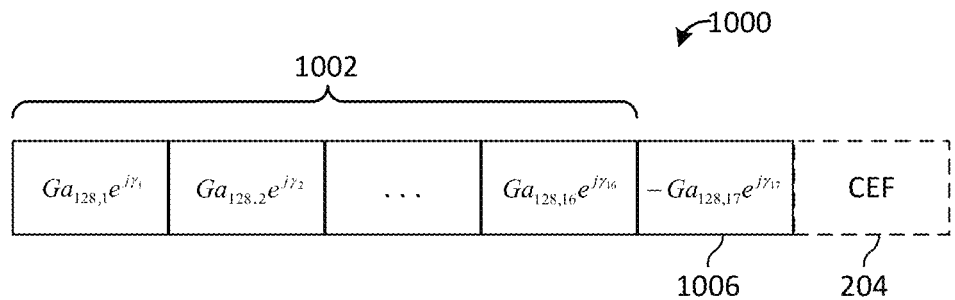
Figure 10B:
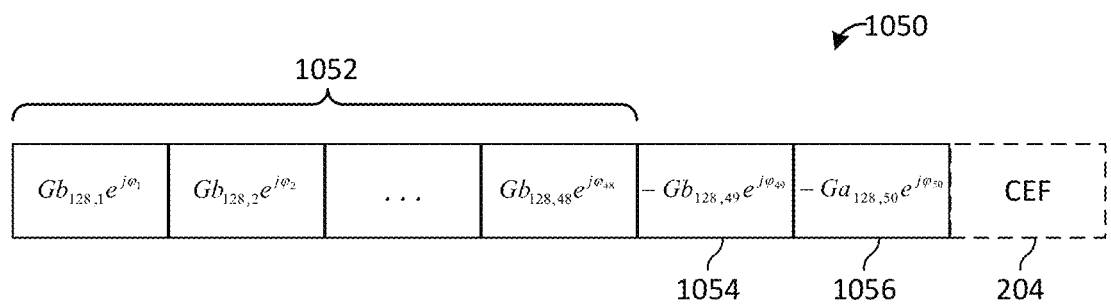

FIGS. 10A and 10B are diagrams of a non-control STF 1000 and a control STF 1050, respectively, which are included in an 802.11ay packet preamble. As shown, each symbol in the preamble component sequences for the non-control STF 400 may be rotated by $e^{j\gamma_k}$, where $\gamma_k=k\pi$ for k=1, . . . , 16, and $\gamma_{17}=0$. Likewise, each symbol in the preamble component sequences for the control STF 450 may be rotated by $e^{j\varphi_k}$, where $\varphi_k=k\pi$ for k=1, . . . , 48, and $\varphi_{49}=\varphi_{50}=0$. Thus, each preamble component sequence in the repeated sequences 1002 may be represented by Ga$_{128,k}e^{j\gamma_k}$, where $\gamma_k \in \{0, 2\pi\}$, and each preamble component sequence in the repeated sequences 1052 may be represented by Gb$_{128,k}e^{j\varphi_k}$, where $\gamma_k \in \{0, 2\pi\}$.

Figure 11A:
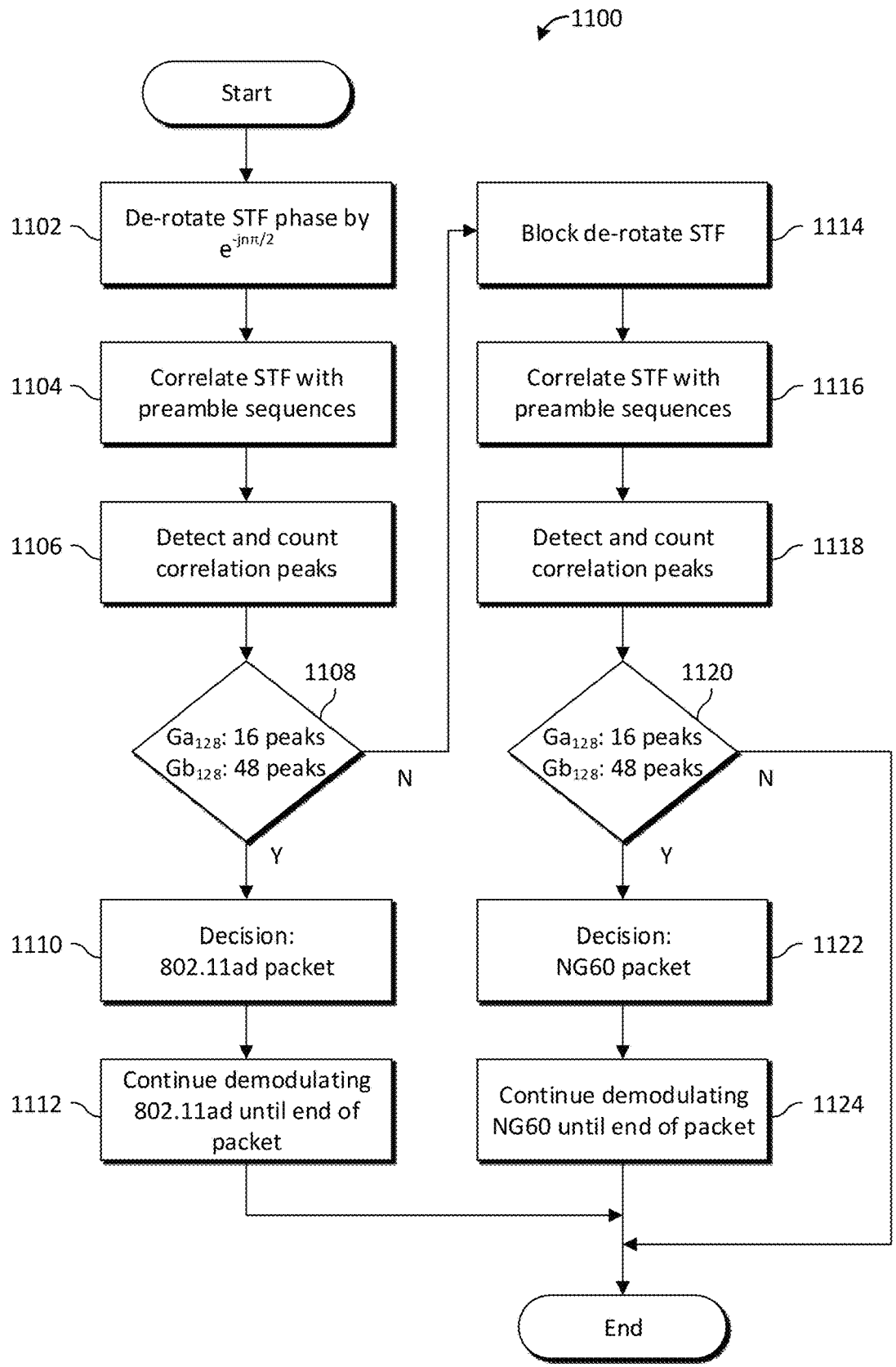

FIG. 11A is a diagram of an embodiment 802.11ay auto-detection method 1100. The 802.11ay auto-detection method 1100 may be indicative of operations occurring in an 802.11ay receiver.

The 802.11ay auto-detection method 1100 beings by de-rotating the phase of a received STF by $$e^{-j\pi\frac{n}{2}}$$

(step 1102). Such a de-rotation may be done to first determine whether the received STF is a BPSK-modulated symbol, e.g., an 802.11ad PHY STF. Next, the de-rotated STF is correlated with the preamble component sequences Ga$_{128}$ and Gb$_{128}$ (step 1104). Next, the correlation peaks for each preamble component sequence are detected and counted (step 1106). If correlation of the received STF produces 16 peaks for the preamble component sequence Ga$_{128}$ or 48 peaks for the preamble component sequence Gb$_{128}$ (step 1108), the packet is identified as an 802.11ad packet (step 1110). Demodulation and decoding of the packet is continued until the end of the 802.11ad packet (step 1112).

If correlation of the received STF does not produce 16 peaks for the preamble component sequence Ga$_{128}$ or 48 peaks for the preamble component sequence Gb$_{128}$, then the phase of the received STF is instead block de-rotated by $e^{-j\gamma_k}$ for a non-control STF, or by $e^{-j\varphi_k}$ for a control STF (step 1114). Next, the block de-rotated STF is correlated with the preamble component sequences Ga$_{128}$ and Gb$_{128}$ (step 1116). Next, the correlation peaks for each preamble component sequence are detected and counted (step 1118). If correlation of the received STF produces 16 peaks for the preamble component sequence $Ga_{128}$ or 48 peaks for the preamble component sequence $Gb_{128}$ (step 1120), the packet is identified as an 802.11ay packet (step 1122). Finally, demodulation and decoding of the packet is continued until the end of the 802.11ay packet (step 1124).

Figure 11B:
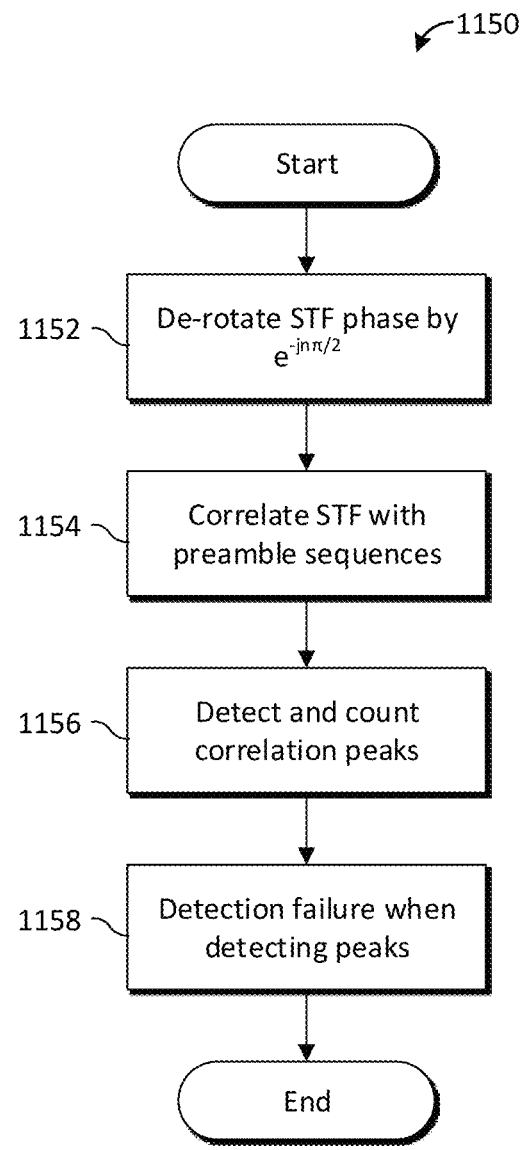

FIG. 11B is a diagram of an embodiment 802.11ad auto-detection method 1150. The 802.11ad auto-detection method 1150 may be indicative of operations occurring in an 802.11ad receiver.

The 802.11ad auto-detection method 1150 begins by de-rotating the phase of a received 802.11ay STF by $$e^{-j\pi\frac{n}{2}}$$

(step 1152). The phase is de-rotated by $$e^{-j\pi\frac{n}{2}}$$

because 802.11ad receivers may only be capable of decoding BPSK-modulated symbols in an STF. Next, the received STF is correlated with the preamble component sequences $Ga_{128}$ and $Gb_{128}$ (step 1154). Next, an attempt is made to detect and count the correlation peaks for each preamble component sequence (step 1156). Finally, a failure occurs when attempting to count the correlation peaks. The failure occurs because the received 802.11ay STF may be modulated with a scheme other than BPSK, e.g., the symbols in the preamble component sequence may be block phase-rotated. An 802.11ad receiver may not detect these symbols. Accordingly, embodiment STFs may not interfere with an existing 802.11ad receiver.

FIGS. 12A-16B illustrate a third auto-detection scheme using STFs in which new preamble component sequences are selected for the control and non-control STFs in an 802.11ay PHY packet. In some embodiments, new preamble component sequences $Ga_{128,new,1}$ and $Gb_{128,new,1}$ are selected such that they are zero correlation zone (ZCZ) sequences with $Ga_{128}$ and $Gb_{128}$, respectively. Ideal ZCZ sequences have an impulse signal (e.g., values of 1 when in-phase and 0 when out-of-phase) when autocorrelated, and a value of 0 when cross-correlated in a certain range of shifts.

FIGS. 12A and 12B show embodiment preamble component sequences $Ga_{128,new,1}$ and $Gb_{128,new,1}$. The ZCZ properties of the preamble component sequences $Ga_{128,new,1}$ and $Gb_{128,new,1}$ may allow the sequences to be used as replacements for the preamble component sequences $Ga_{128}$ and $Gb_{128}$ in the repeated sequences 402 and 452 of the non-control STF 400 and the control STF 450, respectively.

Figure 13A:
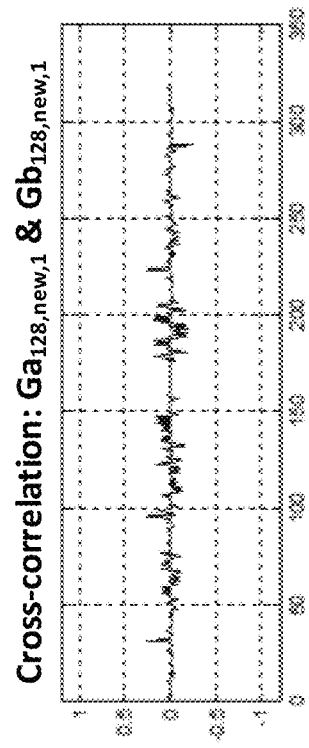
Figure 13C:
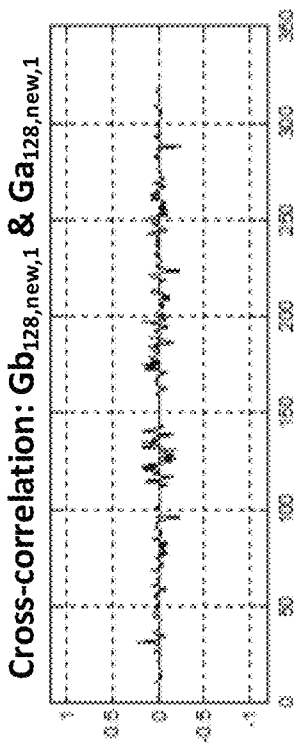
Figure 13B:
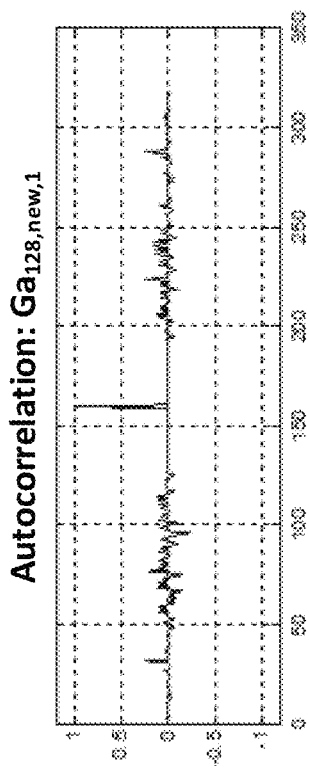

FIGS. 13A-13H are diagrams of various correlation properties of the preamble component sequences $Ga_{128,new,1}$ and $Gb_{128,new,1}$ with the preamble component sequences $Ga_{128}$ and $Gb_{128}$. FIGS. 13A and 13B are diagrams of autocorrelation properties of $Ga_{128,new,1}$ and $Gb_{128,new,1}$, respectively. As shown, the autocorrelation results are impulse responses for shifts within [−32, 32] symbol time slots, and have no correlation for shifts within [−32, 32] symbol time slots. Further, the side lobes for each autocorrelation signal are relatively low. Both the impulse response and the side lobes that result from autocorrelation of $Ga_{128,new,1}$ and $Gb_{128,new,1}$ are comparable to the impulse response and the side lobes that result from autocorrelation of $Ga_{128}$ and $Gb_{128}$, previously shown in the zoomed portions of FIGS. 5A and 5C. It should be appreciated that, although FIGS. 13A-13H illustrate ideal impulse responses, autocorrelation results may not produce true impulses, but rather may produce responses that are of sufficient magnitude for a receiver to recognize the values as correlation peaks.

Figure 13D:
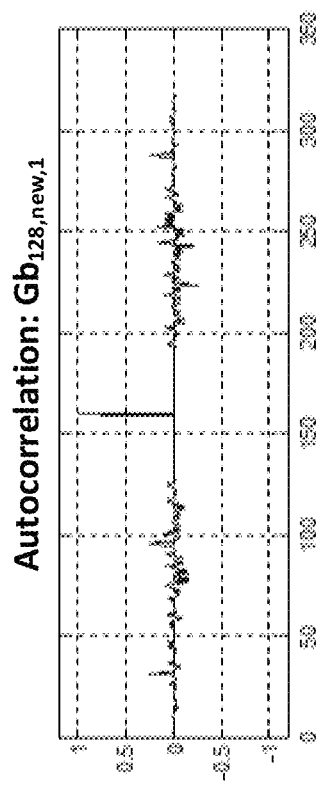

FIGS. 13C and 13D are diagrams of cross-correlation properties of $Ga_{128,new,1}$ and $Gb_{128,new,1}$, respectively. The cross-correlation properties of $Ga_{128,new,1}$ and $Gb_{128,new,1}$ are comparable to the cross-correlations between $Ga_{128}$ and $Gb_{128}$.

Figure 13E:
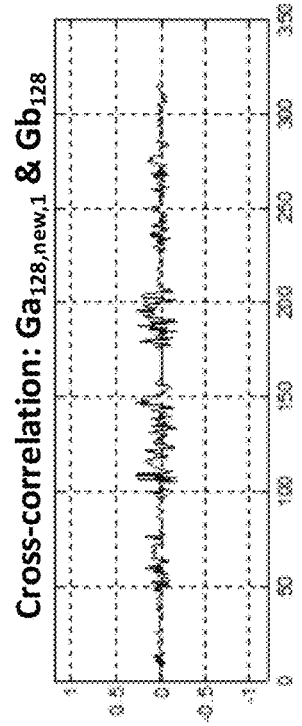
Figure 13F:
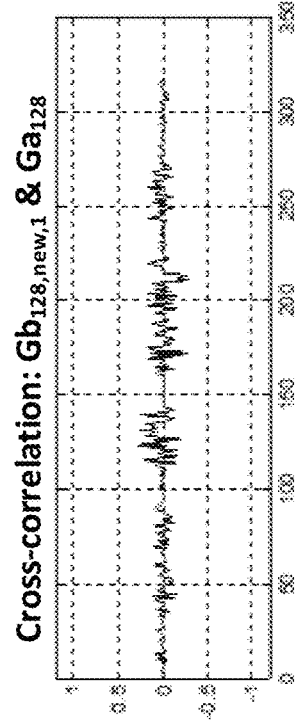

FIGS. 13E and 13F are diagrams of cross-correlation properties between $Ga_{128,new,1}$ and $Ga_{128}$, and between $Gb_{128,new,1}$ and $Gb_{128}$, respectively. As shown, the cross-correlations are equal to zero for shifts within [−32, 32]. Unlike the cross-correlation between $Ga_{128}$ and $Gb_{128}$ (illustrated above in FIG. 5B), there is no noise in the zero correlation zone range for $Ga_{128,new,1}$ and $Gb_{128,new,1}$. Accordingly, an 802.11ad receiver will not detect a false positive when attempting to correlate $Ga_{128}$ or $Gb_{128}$ with $Ga_{128,new,1}$ or $Gb_{128,new,1}$, respectively.

Figure 13G:
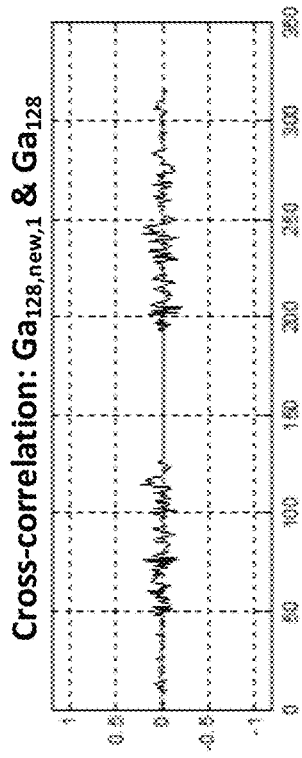
Figure 13H:
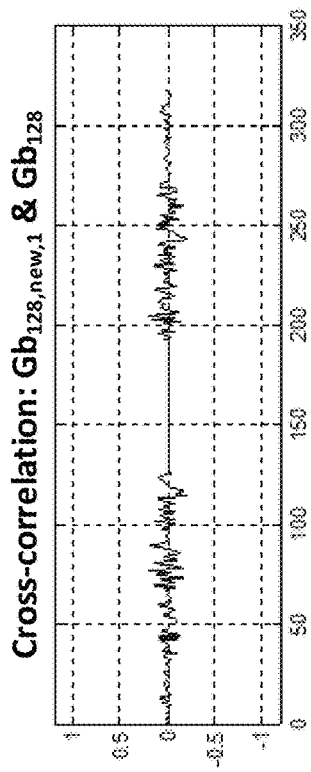

FIGS. 13G and 13H are diagrams of cross-correlation properties between $Ga_{128,new,1}$ and $Gb_{128}$, and between $Gb_{128,new,1}$ and $Ga_{128}$, respectively. The cross-correlation properties between $Ga_{128,new,1}$ and $Gb_{128}$, and between $Gb_{128,new,1}$ and $Ga_{128}$ are comparable to the cross-correlations between $Ga_{128}$ and $Gb_{128}$.

Figure 14A:
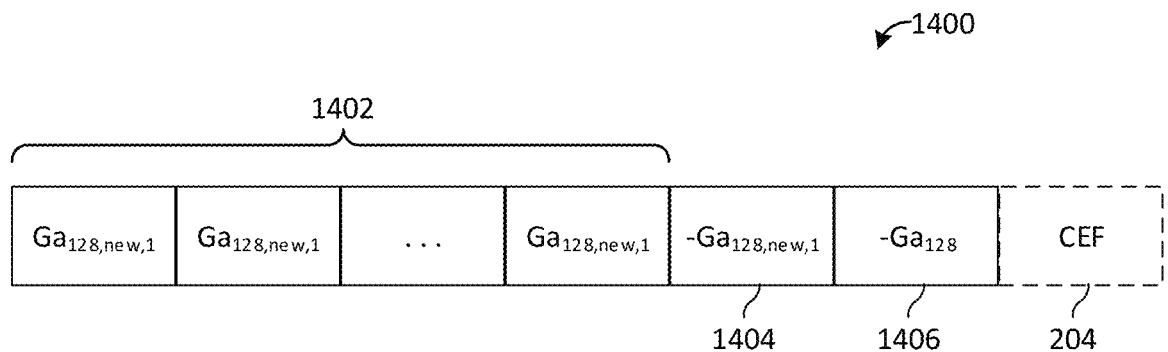
Figure 14B:
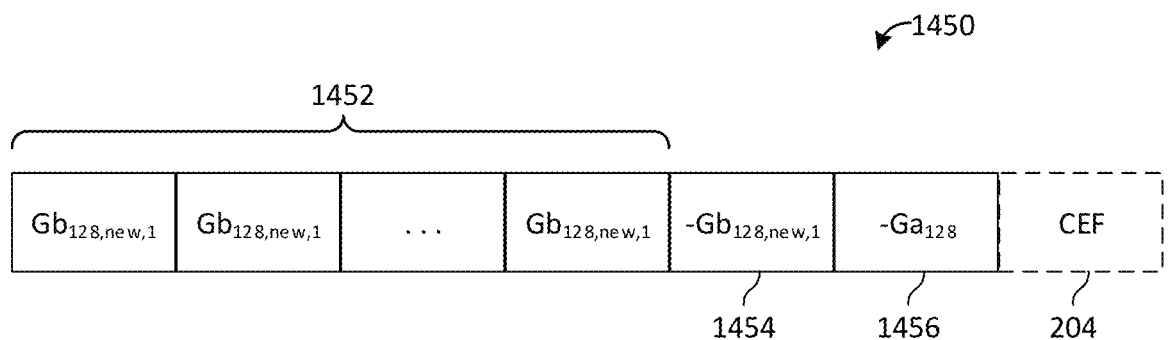
Figure 15A:
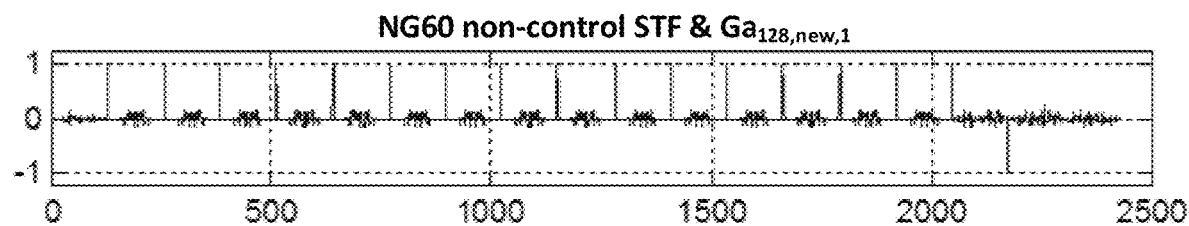
Figure 15B:
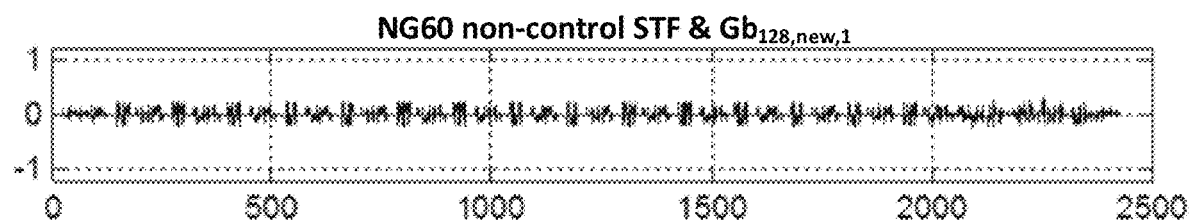
Figure 15C:
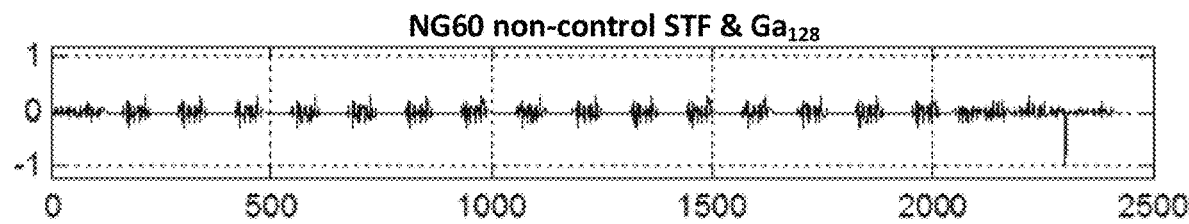
Figure 15D:
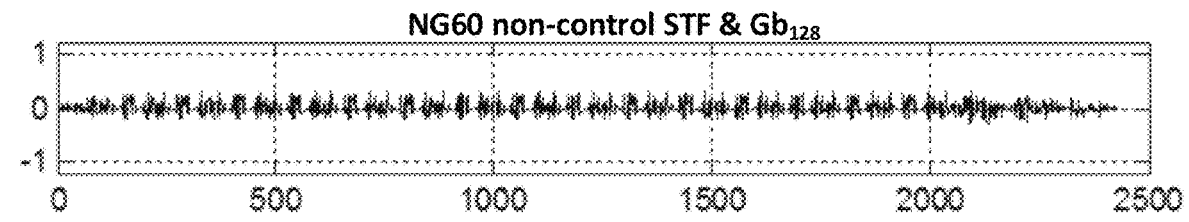
Figure 15E:
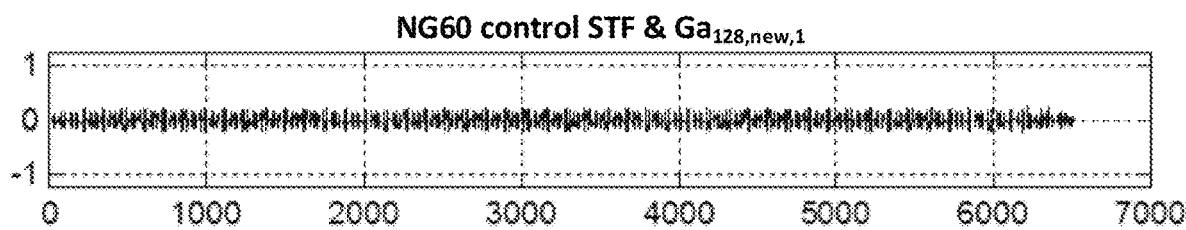
Figure 15F:
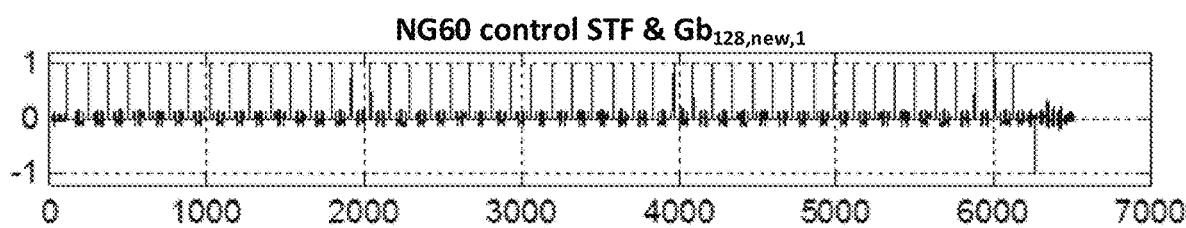
Figure 15G:
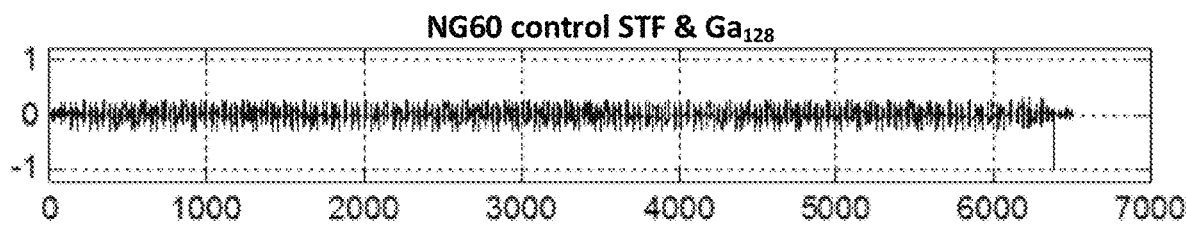
Figure 15H:
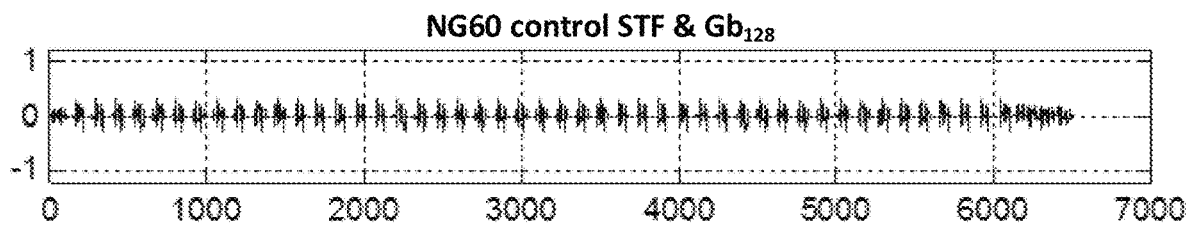

FIGS. 14A and 14B are diagrams of a non-control STF 1400 and a control STF 1450, respectively, which are included in an 802.11ay packet preamble. The non-control STF 1400 and the control STF 1450 each include repeated sequences 1402, 1452, a termination sequence 1404, 1454 which indicates the end of the non-control STF 1400 and the control STF 1450, respectively, and a prefix sequence 1406, 1456.

The repeated sequences 1402, 1452 include multiple repetitions of preamble component sequences. The repeated sequence 1402 includes 16 repetitions of the preamble component sequence $Ga_{128,new,1}$, and the repeated sequence 1452 includes 48 repetitions of the preamble component sequence $Gb_{128,new,1}$. It should be appreciated that the repeated sequences 1402, 1452 could contain any preamble component sequence and number of repetitions.

The termination sequence 1404, 1454 occurs after the repeated sequences 1402, 1452. The termination sequence 1404, 1454 includes one negative instance of the preamble component sequences included in the repeated sequences 1402, 1452. For example, in embodiments where the repeated sequence 1402 includes several repetitions of the preamble component sequence $Ga_{128,new,1}$, the termination sequence 1404 includes one repetition of $-Ga_{128,new,1}$. Likewise, in embodiments where the repeated sequence 1452 includes several repetitions of the preamble component sequence $Gb_{128,new,1}$, the sequence 1454 includes one repetition of $-Gb_{128,new,1}$.

The prefix sequence 1406, 1456 is a cyclic prefix of CEF. It should be noted that the prefix sequence 1406, 1456, i.e., the final preamble component sequence ($-Ga_{128}$) before the CEF, may be the same preamble component sequence at the end of the non-control STF 400 and the control STF 450.

FIGS. 15A-15D are diagrams of cross-correlation properties for the non-control STF 1400 with various preamble component sequences. As shown, the non-control STF 1400 produces 16 positive peaks and a negative peak when correlated with the preamble component sequence $Ga_{128,new,1}$, and produces one negative peak when correlated with the preamble component sequence $Ga_{128}$, but otherwise does not produce a significant signal when correlated with other preamble component sequences. The values produced by cross-correlations of the non-control STF 1400 with sequences other than $Ga_{128,new,1}$ and $Ga_{128}$ may include some noise, but the magnitude of the noise may not be large enough to register as a correlation peak.

FIGS. 15E-15H are diagrams of cross-correlation properties for the control STF 1450 with various preamble component sequences. As shown, the control STF 1450 produces 48 positive peaks and a negative peak when correlated with the preamble component sequence $Gb_{128,new,1}$, and produces one negative peak when correlated with preamble component sequence Gam, but otherwise does not produce a significant signal. The values produced by cross-correlations of the control STF 1450 with sequences other than $Gb_{128,new,1}$ may include some noise, but the magnitude of the noise may not be large enough to register as a correlation peak. Accordingly, proper selection of the symbols for the preamble component sequences used in the non-control STF 1400 and the control STF 1450 may allow the STFs to be auto-detected by a receiver that correlates the STFs with the preamble component sequences $Ga_{128,new,1}$ and $Gb_{128,new,1}$ (e.g., an 802.11ay receiver), but may not interfere with a receiver that correlates the STFs with the preamble component sequences $Ga_{128}$ and $Gb_{128}$ (e.g., an 802.11ad receiver).

Figure 16A:
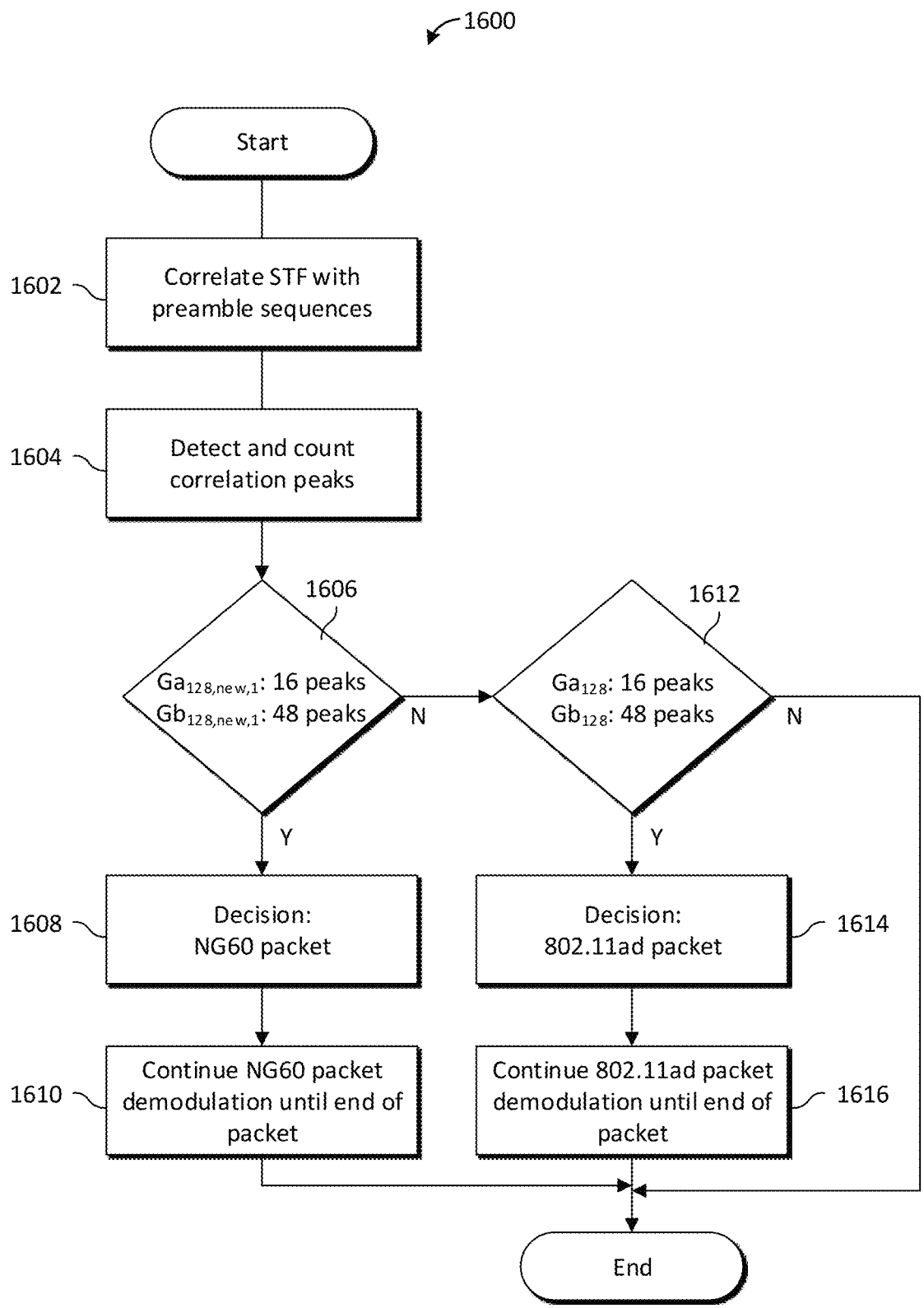

FIG. 16A is a diagram of an embodiment 802.11ay auto-detection method 1600. The 802.11ay auto-detection method 1600 may be indicative of operations occurring in an 802.11 ay receiver when determining the PHY packet type of a received packet using the STF.

The 802.11ay auto-detection method 1600 begins by receiving a STF and correlating it with the preamble component sequences $Ga_{128,new,1}$, $Gb_{128,new,1}$, $Ga_{128}$, and $Gb_{128}$ (step 1602). Next, the correlation peaks for each preamble component sequence are detected and counted (step 1604). If correlation of the received STF produces 16 peaks for the preamble component sequence $Ga_{128,new,1}$ or 48 peaks for the preamble component sequence $Gb_{128,new,1}$ (step 1606), the packet is identified as an 802.11ay packet (step 1608). In cases where correlation with one preamble component sequence produces peaks, correlation with the other sequence may produce lower values that have no significance. For example, if 16 peaks are produced when correlated with the preamble component sequence $Ga_{128,new,1}$, then no values are produced when correlated with the preamble component sequence $Gb_{128,new,1}$. Next, demodulation and decoding of the packet is continued until the end of the 802.11ay packet (step 1610).

If instead, correlation of the STF produces 16 peaks for the preamble component sequence $Ga_{128}$ or 48 peaks for the preamble component sequence $Gb_{128}$ (step 1612), the packet is identified as an 802.11ad packet (step 1614). Finally, demodulation and decoding of the packet is continued until the end of the 802.11ad packet (step 1616).

Figure 16B:
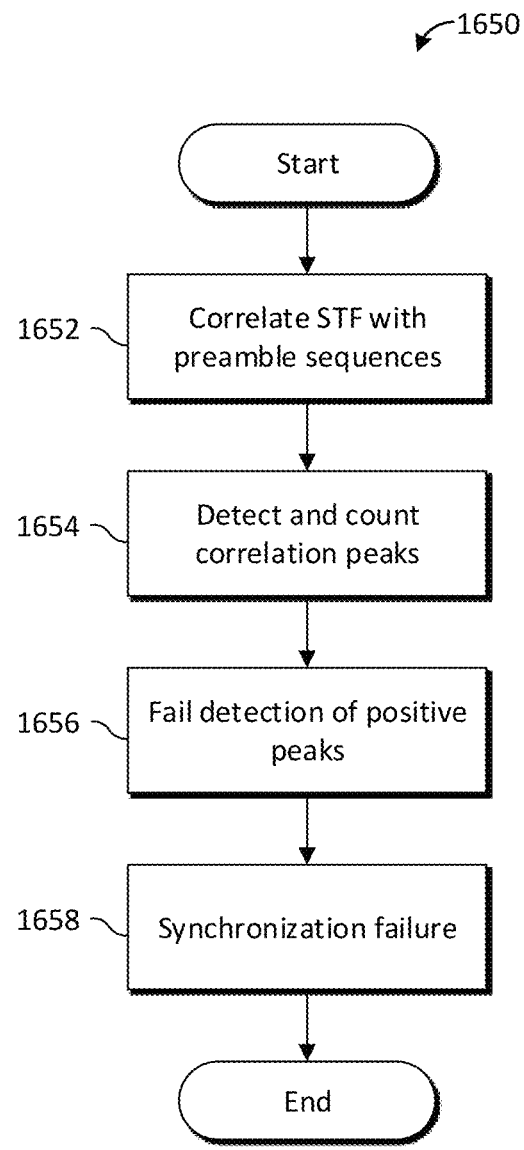

FIG. 16B is a diagram of an embodiment 802.11ad auto-detection method 1650. The 802.11ad auto-detection method 1650 may be indicative of operations occurring in an 802.11ad receiver when determining the PHY packet type of a received packet using the STF. Because an 802.11ad receiver may not capable of responding to 802.11ay traffic, the 802.11ad auto-detection method 1650 may thus avoid incorrectly identifying a received 802.11ay packet as a compatible packet for an 802.11ad receiver.

The 802.11ad auto-detection method 1650 begins by receiving an 802.11ay STF and correlating it with the preamble component sequences $Ga_{128}$ and $Gb_{128}$ (step 1652). Next, the correlation peaks for each preamble component sequence are detected and counted (step 1654). Next, an attempt to detect positive peaks in the correlated preamble component sequences is attempted, but fails (step 1656). Detection fails because the received STFs contain the preamble component sequence $Ga_{128,new,1}$ and $Gb_{128,new,1}$, which are ZCZ sequences with $Ga_{128}$ and $Gb_{128}$, as shown in FIGS. 13E and 13F, and thus correlation does not produce significant values. Finally, the failed STF detection causes a synchronization failure (step 1658). Thus, the 802.11ad auto-detection method 1650 allows an 802.11ad receiver to fail auto-detection when it receives an incompatible 802.11ay PHY packet, causing the receiver to ignore the remainder of the PHY packet.

FIGS. 17A-21B illustrate a fourth auto-detection scheme using STFs in which new preamble component sequences are selected for the control and non-control STFs in an 802.11ay PHY packet. In some embodiments, new preamble component sequences $Ga_{128,new,2}$ and $Gb_{128,new,2}$ are selected such that they are mutual zero correlation zone (ZCZ) sequences, e.g., the sequences produce no correlation peaks when cross-correlated in a certain range of shifts.

FIGS. 17A and 17B show embodiment preamble component sequences $Ga_{128,new,2}$ and $Gb_{128,new,2}$. The mutual ZCZ properties of the preamble component sequences $Ga_{128,new,2}$ and $Gb_{128,new,2}$ allows the sequences to be used as replacements for the preamble component sequences $Ga_{128}$ and $Gb_{128}$ in the repeated sequences 402, 452 of the non-control STF 400 and the control STF 450. Because the preamble component sequences $Ga_{128,new,2}$ and $Gb_{128,new,2}$ produce no correlation peaks when cross-correlated, there may be a reduced possibility of incorrectly identifying a PHY packet as a control or non-control packet based on the STF.

Figure 18A:
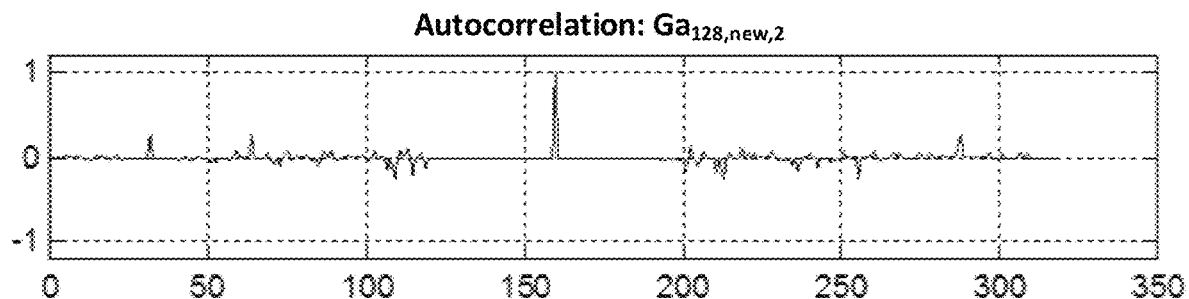
Figure 18B:
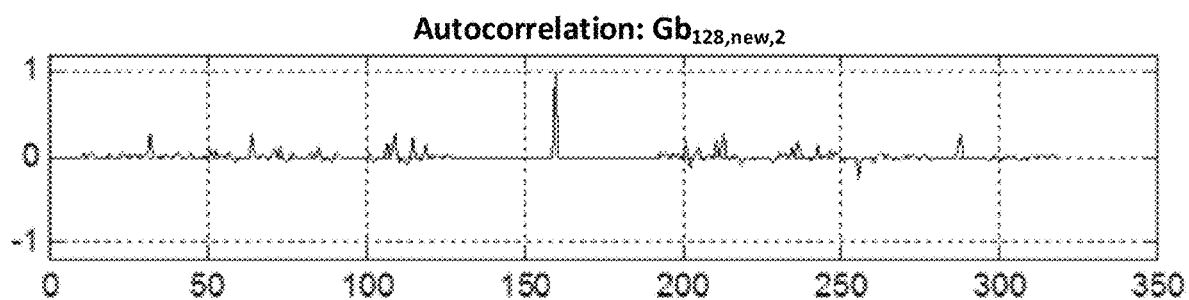
Figure 18C:
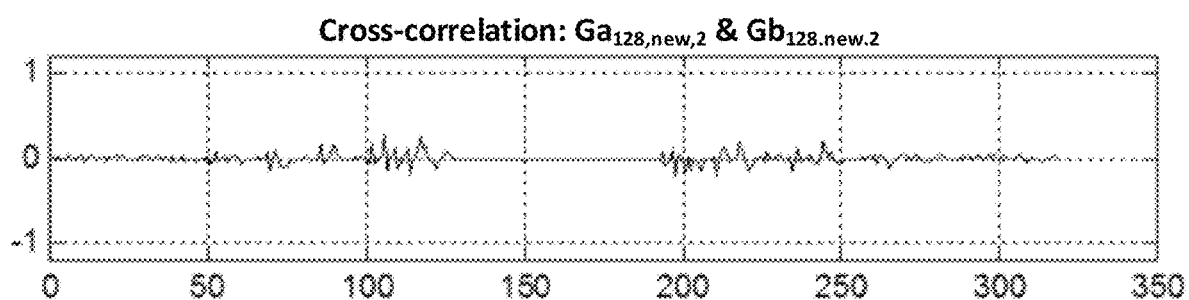

FIG. 18A-18C are diagrams of various correlation properties of the preamble component sequences $Ga_{128,new,2}$ and $Gb_{128,new,2}$. FIGS. 18A and 18B show autocorrelation properties of $Ga_{128,new,2}$ and $Gb_{128,new,2}$, respectively. As shown, the autocorrelations have an impulse response property. Further, values at the side lobes of each autocorrelation are relatively low, and may be even lower than values at the side lobes of autocorrelations for the preamble component sequences $Ga_{128,new,2}$ and $Gb_{128,new,2}$ (shown in FIGS. 13A and 13B). Both the impulse response and side lobes for $Ga_{128,new,2}$ and $Gb_{128,new,2}$ are comparable to the impulse response and side lobes for $Ga_{128}$ and $Gb_{128}$, previously shown in the zoomed portions of FIGS. 5A and 5C.

FIG. 18C is a diagram of a cross-correlation property of $Ga_{128,new,2}$ and $Gb_{128,new,2}$. $Ga_{128,new,2}$ and $Gb_{128,new,2}$ have a higher degree of correlation than the cross-correlation between $Ga_{128}$ and $Gb_{128}$. As shown in FIG. 18C, the cross-correlation of the preamble component sequences $Ga_{128,new,2}$ and $Gb_{128,new,2}$ produces relatively low values.

Figure 19A:
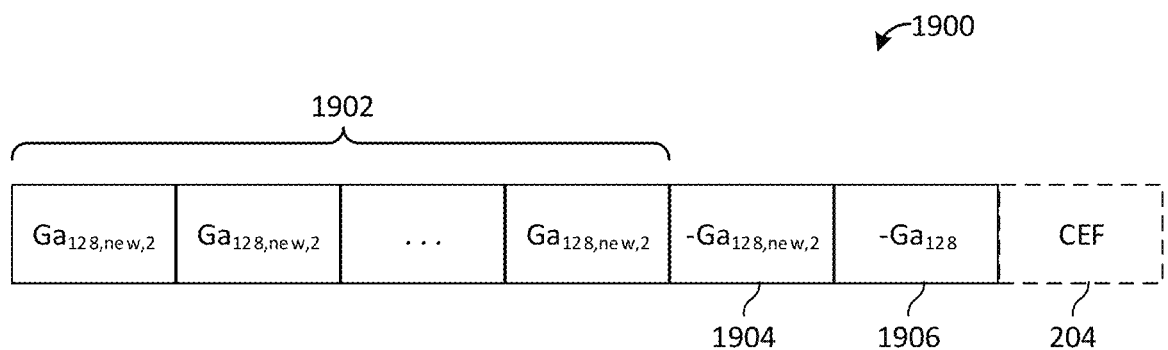
Figure 19B:
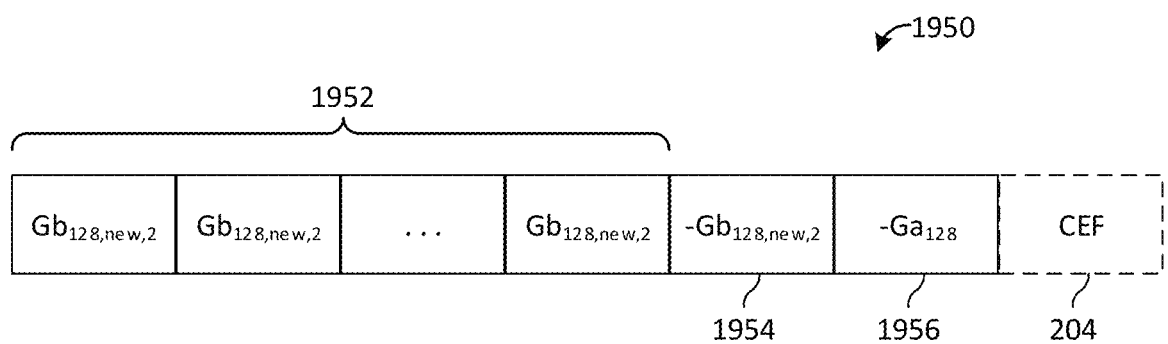
Figure 20A:
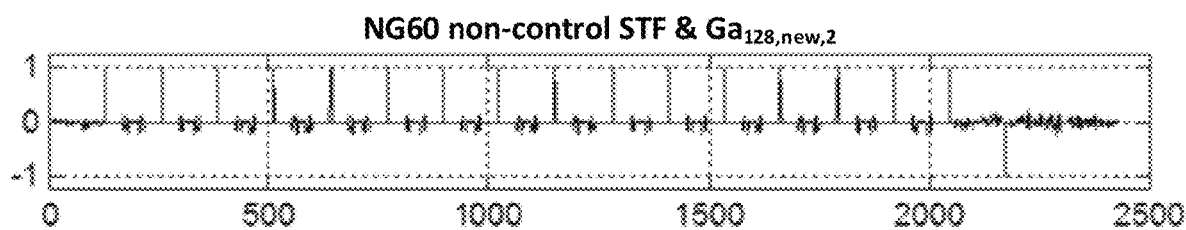
Figure 20B:
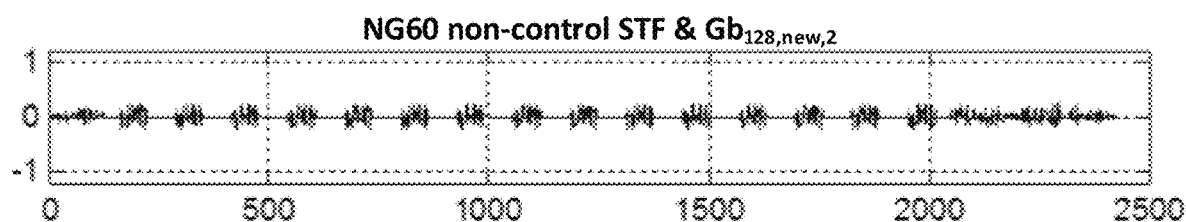
Figure 20C:
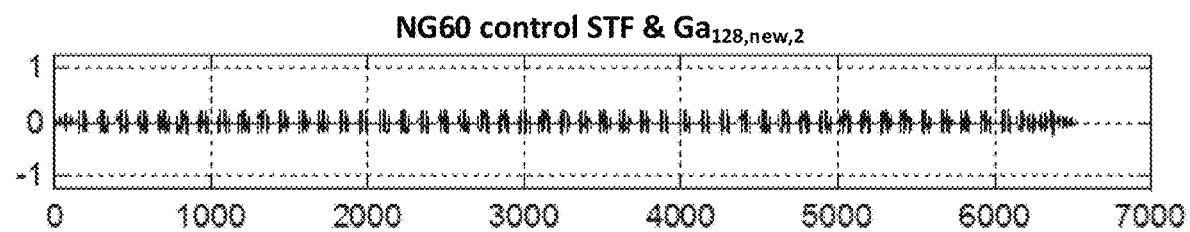
Figure 20D:
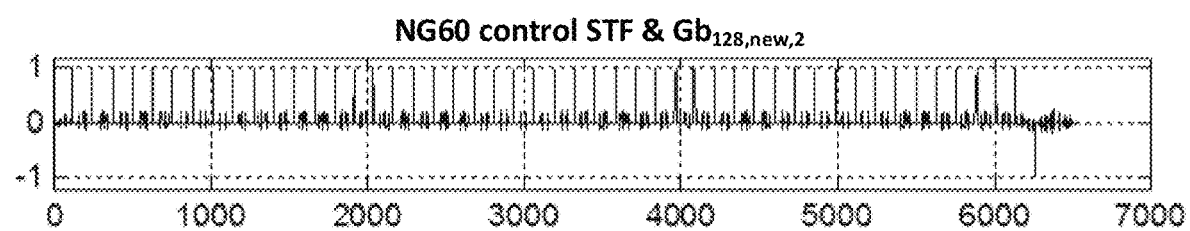

FIGS. 19A and 19B are diagrams of a non-control STF 1900 and a control STF 1950, respectively, which are included in an 802.11ay packet preamble. The non-control STF 1900 and the control STF 1950 each include repeated sequences 1902, 1952, a termination sequence 1904, 1954, and a prefix sequence 1906, 1956.

The repeated sequences 1902, 1952 include multiple repetitions of the preamble component sequences. The repeated sequence 1902 includes 16 repetitions of the preamble component sequence $Ga_{128,new,2}$, and the repeated sequence 1952 includes 48 repetitions of the preamble component sequence $Gb_{128,new,2}$. It should be appreciated that the repeated sequences 1902, 1952 could contain any preamble component sequence and number of repetitions, as discussed further below.

The termination sequence 1904, 1954 occurs after the repeated sequences 1902, 1952. The sequence 1904, 1954 includes one negative instance of the preamble component sequences included in the repeated sequences 1902, 1952. For example, in embodiments where the repeated sequence 1902 includes several repetitions of the preamble component sequence $Ga_{128,new,2}$, the sequence 1904 includes one repetition of $-Ga_{128,new,2}$. Likewise, in embodiments where the repeated sequence 1952 includes several repetitions of the preamble component sequence $Gb_{128,new,2}$, the sequence 1954 includes one repetition of $-Gb_{128,new,2}$.

The prefix sequence 1906, 1956 indicates the end of the non-control STF 1900 and the control STF 1950, respectively. It should be noted that the prefix sequence 1906, 1956, i.e., the final preamble component sequence (-Gam) before the CEF, may be the same as the final sequence in the non-control STF 400 and the control STF 450. Accordingly, an 802.11ad receiver may still be capable of identifying the end of an 802.11ay STF, even though an 802.11ad receiver may not be completely compatible with 802.11ay PHY packets. The prefix sequence 1906, 1956 is a cyclic prefix for the CEF 204.

FIGS. 20A-20D show cross-correlation properties for the non-control STF 1900 and the control STF 1950 with the preamble component sequences $Ga_{128,new,2}$ and $Gb_{128,new,2}$. As shown, the non-control STF 1900 produces 16 positive peaks and a negative peak when correlated with the preamble component sequence $Ga_{128,new,2}$, but otherwise does not produce a significant signal when correlated with other preamble component sequences. Likewise, the control STF 1950 produces 48 positive peaks and a negative peak when correlated with the preamble component sequence $Gb_{128,new,2}$, but otherwise does not produce a significant signal when correlated with other preamble component sequences. The values produced by cross-correlations of the non-control STF 1900 and the control STF 1950 with sequences other than $Ga_{128,new,2}$ and $Gb_{128,new,2}$ may include some noise, but the magnitude of the noise may not be large enough to register as a correlation peak. Accordingly, proper selection of the symbols for the preamble component sequences used in the non-control STF 1900 and the control STF 1950 may allow the STFs to be auto-detected by a receiver that correlates the STFs with the preamble component sequences $Ga_{128,new,2}$ and $Gb_{128,new,2}$ (e.g., an 802.11ay receiver), but may not interfere with a receiver that correlates the STFs with the preamble component sequences $Ga_{128}$ and $Gb_{128}$ (e.g., an 802.11ad receiver). Cross-correlation properties of the non-control STF 1900 and the control STF 1950 with other preamble component sequences (e.g., $Ga_{128}$, $Gb_{128}$) may be similar to properties discussed above with respect to FIGS. 15A-15H. Because $Ga_{128,new,2}$ and $Gb_{128,new,2}$ are mutual ZCZ sequences, they produce less noise when cross-correlated than $Ga_{128,new,1}$ and $Gb_{128,new,1}$. For example, FIG. 20A contains the same quantity of peaks as FIG. 15A, but has less noise.

Figure 21A:
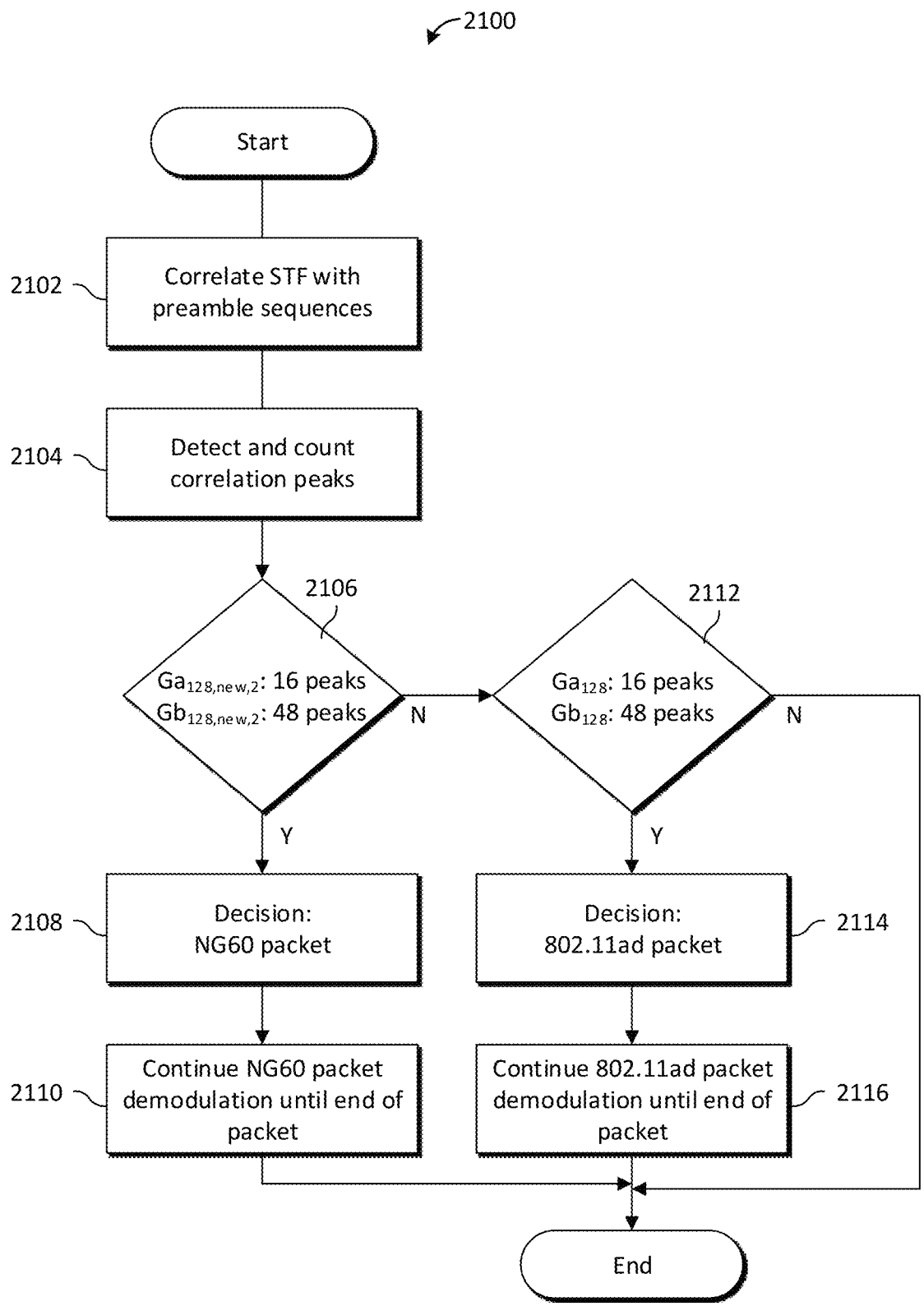

FIG. 21A is a diagram of an embodiment 802.11ay auto-detection method 2100. The 802.11ay auto-detection method 2100 may be indicative of operations occurring in an 802.11 ay receiver when determining the PHY packet type of a received packet using the STF.

The 802.11ay auto-detection method 1600 begins by receiving a STF and correlating it with the preamble component sequences $Ga_{128,new,2}$, $Gb_{128,new,2}$, $Ga_{128}$, and $Gb_{128}$ (step 2102). Next, the correlation peaks for each preamble component sequence are detected and counted (step 2104). If correlation of the received STF produces 16 peaks for the preamble component sequence $Ga_{128,new,2}$ or 48 peaks for the preamble component sequence $Gb_{128,new,2}$ (step 2106), the packet is identified as an 802.11ay packet (step 2108). In cases where correlation with one preamble component sequence produces peaks, correlation with the other sequence may produce lower values that have no significance. For example, if 16 peaks are produced when correlated with the preamble component sequence $Ga_{128,new,2}$, then no values are produced when correlated with the preamble component sequence $Gb_{128,new,2}$. Next, demodulation and decoding of the packet is continued until the end of the 802.11ay packet (step 2110).

If instead, correlation of the STF produces 16 peaks for the preamble component sequence $Ga_{128}$ or 48 peaks for the preamble component sequence $Gb_{128}$ (step 2112), the packet is identified as an 802.11ad packet (step 2114). Finally, demodulation and decoding of the packet is continued until the end of the 802.11ad packet (step 2116).

Figure 21B:
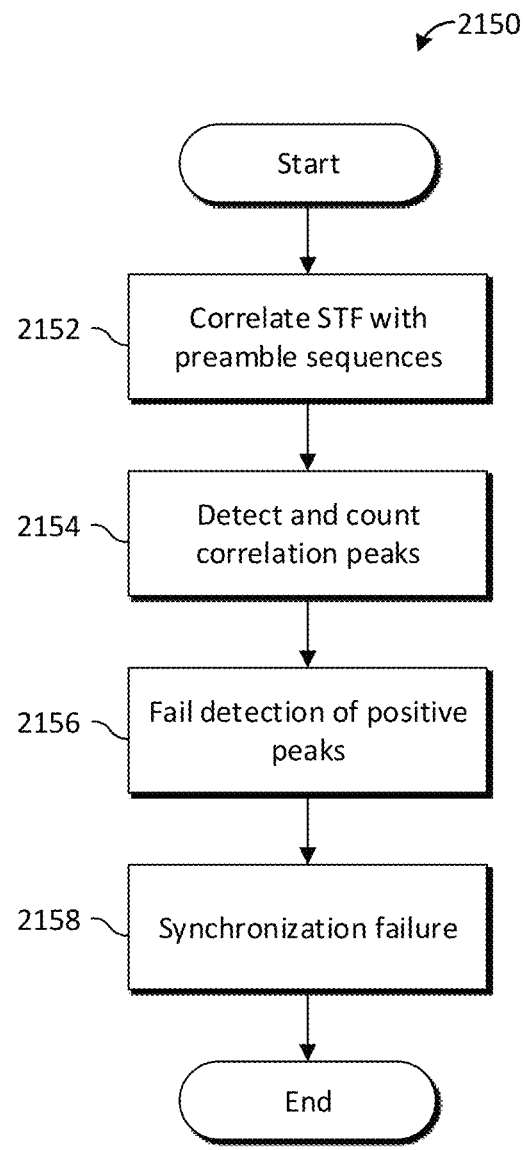

FIG. 21B is a diagram of an embodiment 802.11ad auto-detection method 2150. The 802.11ad auto-detection method 2150 may be indicative of operations occurring in an 802.11ad receiver when determining the PHY packet type of a received packet using the STF. Because an 802.11ad receiver may not capable of detecting 802.11ay packet, the 802.11ad auto-detection method 2150 may thus avoid incorrectly identifying a received 802.11ay packet as a compatible packet for an 802.11ad receiver.

The 802.11ad auto-detection method 2150 begins by receiving an 802.11ay STF and correlating it with the preamble component sequences $Ga_{128}$ and $Gb_{128}$ (step 2152). Next, the correlation peaks for each preamble component sequence are detected and counted (step 2154). Next, an attempt to detect positive peaks in the correlated preamble component sequences is attempted, but fails (step 2156). Detection fails because the received STFs contain the preamble component sequence $Ga_{128,new,2}$ and $Gb_{128,new,2}$, which are mutual ZCZ sequences and do not correlate with $Ga_{128}$ and $Gb_{128}$, as shown in FIGS. 20C-20D and 20G-20H. Finally, the failed detection causes a synchronization failure (step 2158). Thus, the 802.11ad auto-detection method 2150 allows an 802.11ad receiver to gracefully fail auto-detection and continue operating when it receives an incompatible 802.11ay PHY packet.

FIGS. 22A-25B illustrate a fifth auto-detection scheme using STFs in which new preamble component sequences are selected for the control and non-control STFs in an 802.11ay PHY packet. In some embodiments, new preamble component sequences $A_{128}$ and $B_{128}$ are selected such that the sequences are quadrature phase shift keying (QPSK) modulated variants of the preamble component sequences $Ga_{128}$ and $Gb_{128}$.

$$A_{128}=\alpha \cdot Ga_{128}+\beta \cdot Ga_{128,new,1} \cdot e^{j\pi/2} B_{128}=\alpha \cdot Gb_{128}+ \\ \beta \cdot Gb_{128,new,1} \cdot e^{j\pi/2} 0<\alpha,\beta<1,\alpha^2+ \\ \beta^2=1 A_{128}'=\alpha \cdot Ga_{128}+\beta \cdot Gb_{128,new,1} \cdot \\ e^{j\pi/2} B_{128}'=\alpha \cdot Gb_{128}+\beta \cdot Ga_{128,new,1} \cdot e^{j\pi/2} 0<\alpha,\beta<1, \\ \alpha^2+\beta^2=1$$

Figures 22A, 22B:
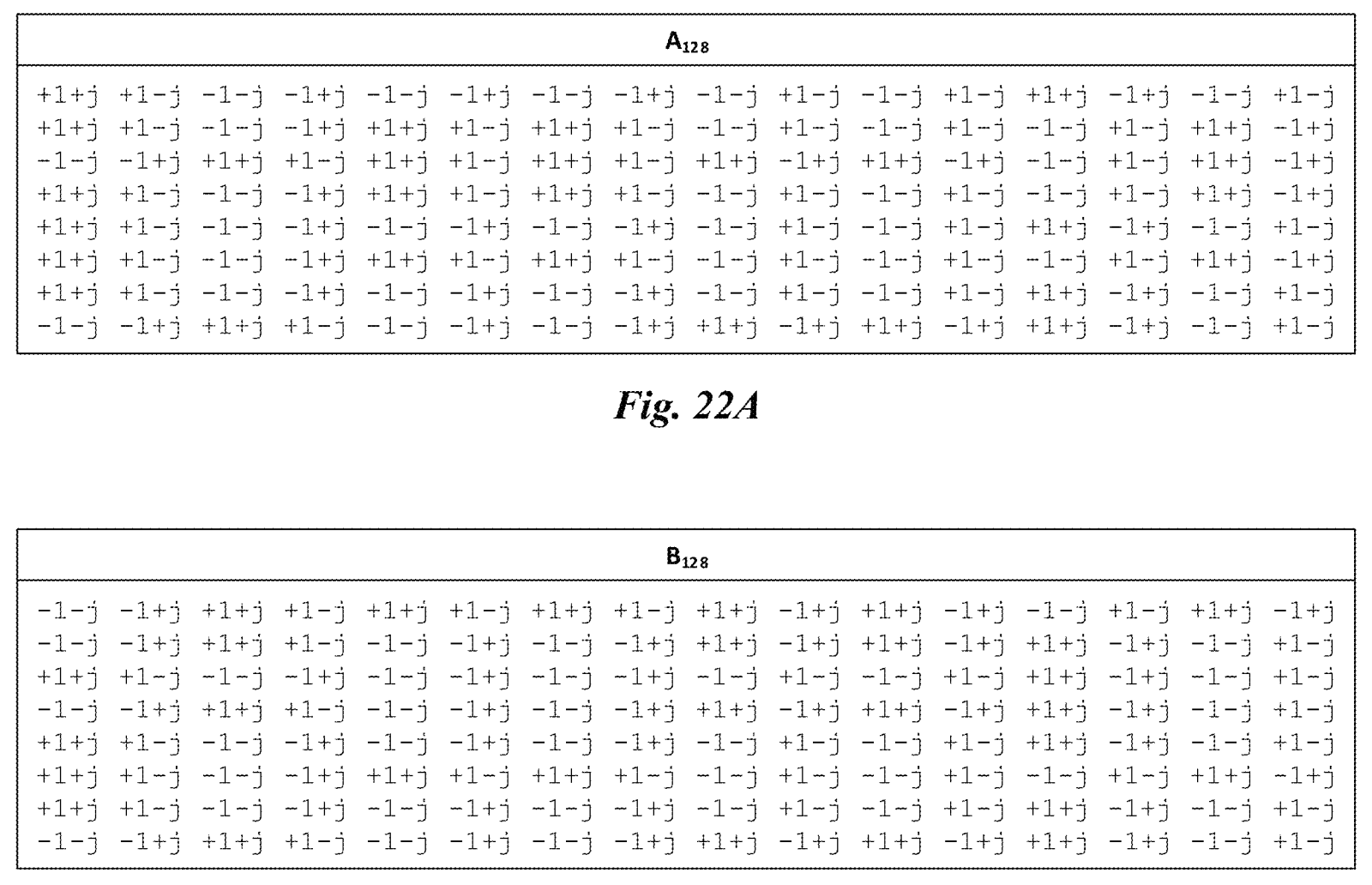

FIGS. 22A-22B show embodiment preamble component sequences $A_{128}$ and $B_{128}$, respectively. The preamble component sequences $A_{128}$ and $B_{128}$ are chosen such that $$0<\alpha,\beta<1, \alpha^2+\beta^2=10<\alpha,\beta<1, \alpha^2+\beta^2=1 \text{ and}$$

$$0<\alpha,\beta<1, \alpha^2+\beta^2=10<\alpha,\beta<1, \alpha^2+\beta^2<1$$

where. Thus, the preamble component sequences $A_{128}$ and $B_{128}$ are QPSK-modulated. This allows the preamble component sequences $A_{128}$ and $B_{128}$ to be backwards-compatible with other wireless techniques. In some embodiments, the preamble component sequences $Ga_{128,new,1}$ and $Gb_{128,new,1}$ may be interchanged such that the imaginary portions of $A_{128}$ and $B_{128}$ are replaced with one another to produce preamble component sequences $A_{128}'$ and $B_{128}'$ such that $$0<\alpha,\beta<1, \alpha^2+\beta^2=10<\alpha,\beta<1, \alpha^2+\beta^2=1 \text{ and}$$

$$0<\alpha,\beta<1, \alpha^2+\beta^2=10<\alpha,\beta<1, \alpha^2+\beta^2<1$$

where. It should be appreciated that in some embodiments $A_{128}$ and $B_{128}$ may be interchanged. Because the preamble component sequences $A_{128}$ and $B_{128}$ are QPSK-modulated variants of the preamble component sequences $Ga_{128}$ and $Gb_{128}$, correlation of the preamble component sequences $A_{128}$ and $B_{128}$ with $Ga_{128}$ and $Gb_{128}$, respectively, may produce values that are equivalent to impulse responses in a certain range of shifts.

$$0<\alpha,\beta<1, \alpha^2+\beta^2=10<\alpha,\beta<1, \alpha^2+\beta^2=1$$

$$0<\alpha,\beta<1, \alpha^2+\beta^2=10<\alpha,\beta<1, \alpha^2+\beta^2=1$$

$$0<\alpha,\beta<1, \alpha^2+\beta^2=10<\alpha,\beta<1, \alpha^2+\beta^2=1$$

$$0<\alpha,\beta<1, \alpha^2+\beta^2=10<\alpha,\beta<1, \alpha^2+\beta^2=1$$

Figure 23A:
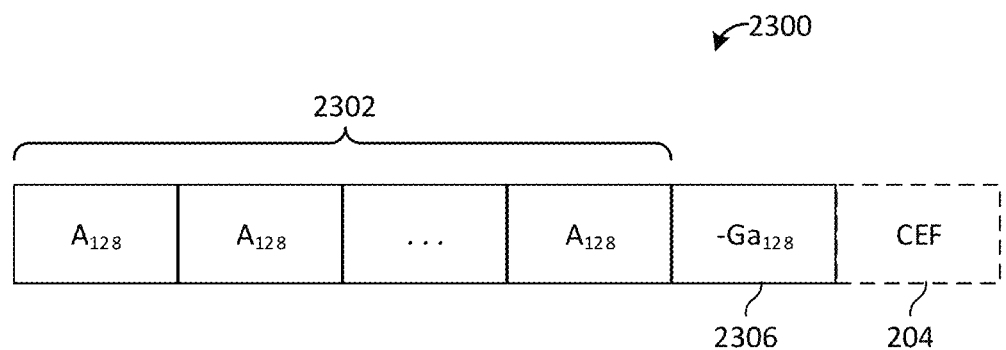
Figure 23B:
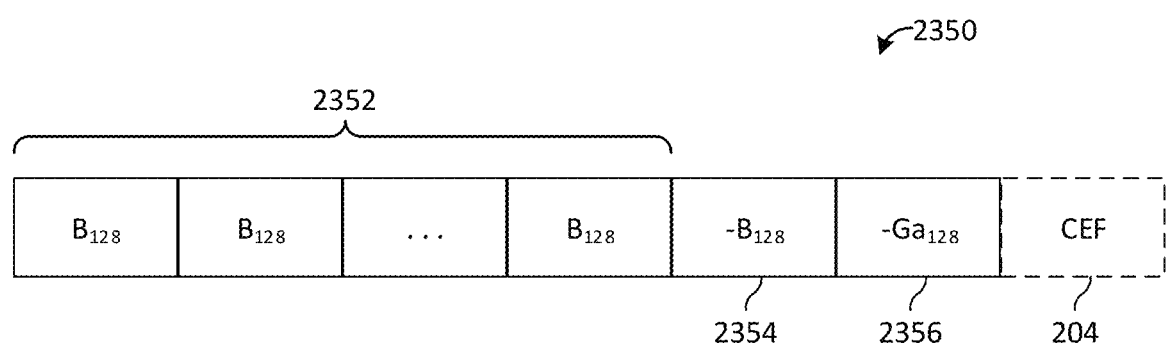

FIGS. 23A and 23B are diagrams of a non-control STF 2300 and a control STF 2350, respectively, which are included in an 802.11ay packet preamble. The non-control STF 2300 and the control STF 2350 each include repeated sequences 2302, 2352 and a termination sequence 2306, 2356. The control STF 2350 also includes a sequence 2354 interposed between the repeated sequence 2352 and the termination sequence 2356. In some embodiments, the non-control STF 2300 may also include a sequence after the repeated sequence 2302.

The repeated sequences 2302, 2352 include multiple repetitions of the preamble component sequences. The repeated sequence 2302 includes 16 repetitions of the preamble component sequence $A_{128}$, and the repeated sequence 2352 includes 48 repetitions of the preamble component sequence $B_{128}$. It should be appreciated that the repeated sequences 2302, 2352 could contain any preamble component sequence and number of repetitions.

The sequence 2354 occurs after the repeated sequence 2352. The sequence 2354 includes one negative instance of the preamble component sequences included in the repeated sequence 2352. For example, in embodiments where the repeated sequence 2352 includes several repetitions of the preamble component sequence $B_{128}$, the sequence 2354 includes one repetition of $-B_{128}$.

The termination sequence 2306, 2356 is used as a cyclic prefix for the CEF 204 in the non-control STF 2300 and the control STF 2350, respectively. It should be noted that the termination sequence 2306, 2356, i.e., the final preamble component sequence ($-Ga_{128}$) before the CEF, may be the same as the final preamble component sequence ($-Ga_{128}$) before the CEF the non-control STF 400 and the control STF 450.

Because the preamble component sequences $A_{128}$ and $B_{128}$ are QPSK-modulated variants of the preamble component sequences $Ga_{128}$ and $Gb_{128}$, correlation of the non-control STF 2300 with $Ga_{128}$ by a receiver may produce 16 positive peaks and one negative peak, and correlation of the control STF 2350 with $Gb_{128}$ by a receiver may produce 48 positive peaks and one negative peak.

Figure 24A:
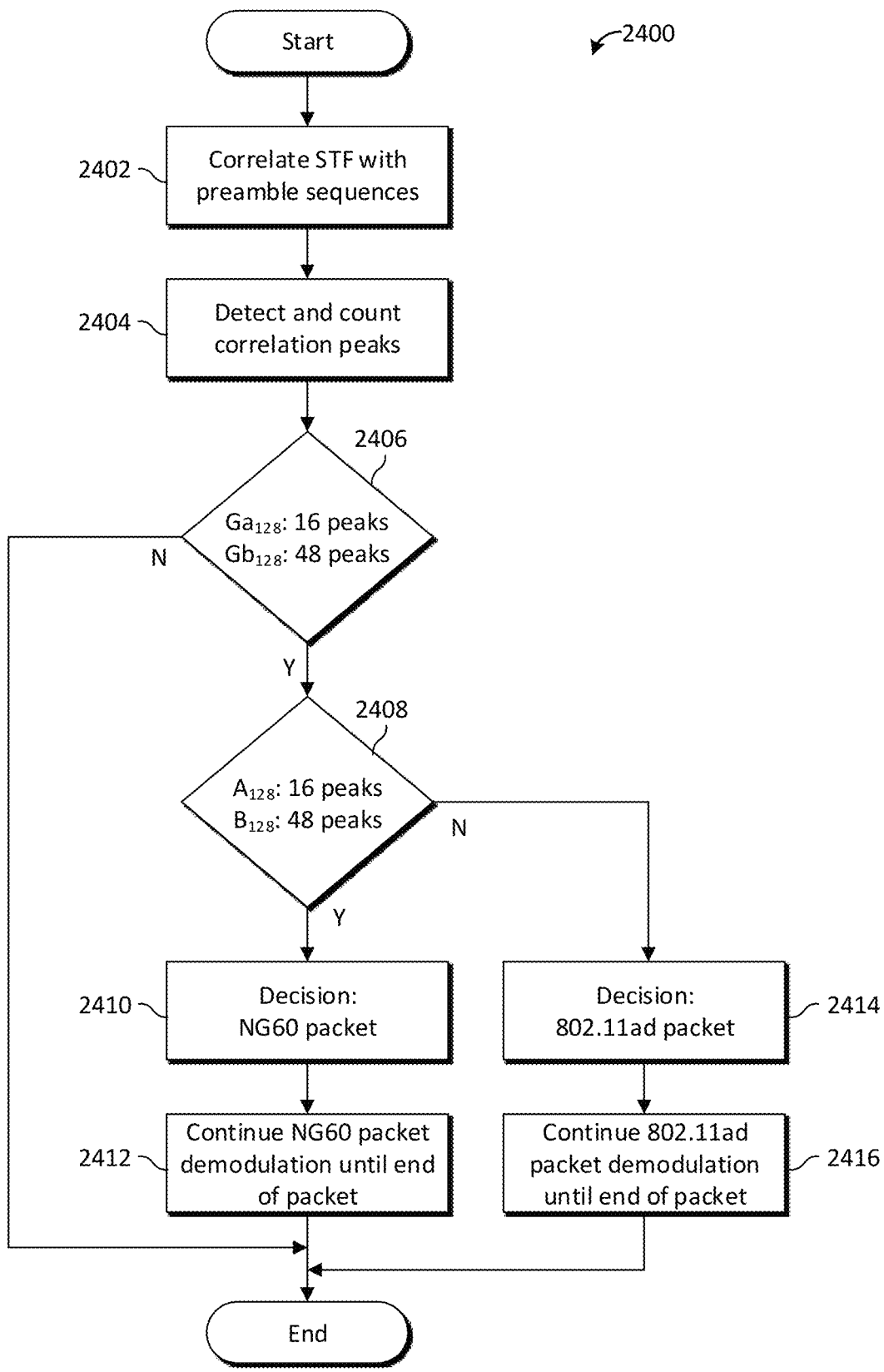

FIG. 24A is a diagram of an embodiment 802.11ay auto-detection method 2400. The 802.11ay auto-detection method 2400 may be indicative of operations occurring in an 802.11ay receiver when determining the PHY packet type of a received packet using the STF.

The 802.11ay auto-detection method 2400 begins by receiving a STF and correlating it with the preamble component sequences $A_{128}$, $B_{128}$, $Ga_{128}$, and $Gb_{128}$ (step 2402). Next, the correlation peaks for each preamble component sequence are detected and counted (step 2404). If correlation of the received STF produces 16 peaks for the preamble component sequence Gam or 48 peaks for the preamble component sequence $Gb_{128}$ (step 2406), the packet is identified as one of an 802.11ay packet or an 802.11ad packet. If correlation peaks are not detected for either of the preamble component sequences $Ga_{128}$ or $Gb_{128}$, then the 802.11ay auto-detection method 2400 concludes. Such a failure may occur, for example, when an 802.11ay receiver receives an incompatible PHY packet.

If correlation peaks are detected for the either of the preamble component sequences $Ga_{128}$ or $Gb_{128}$, the 802.11ay auto-detection method 2400 continues by determining whether correlation of the received STF produces 16 peaks for the preamble component sequence $A_{128}$ or 48 peaks for the preamble component sequence $B_{128}$ (step 2408). If so, the packet is identified as an 802.11ay packet (step 2410). Next, demodulation and decoding of the packet is continued until the end of the 802.11ay packet (step 2412).

If correlation of the received STF does not produce 16 peaks for the preamble component sequence $A_{128}$ or 48 peaks for the preamble component sequence $B_{128}$, then the packet is identified as an 802.11ad packet (step 2414). Finally, demodulation and decoding of the packet is continued until the end of the 802.11ad packet (step 2416). Accordingly, an 802.11ay receiver may be capable of detecting reception of a compatible PHY packet by correlating its STF with $Ga_{128}$ and $Gb_{128}$, and then further correlating the received STF with $A_{128}$ and $B_{128}$ to auto-detect the received PHY packet type.

Figure 24B:
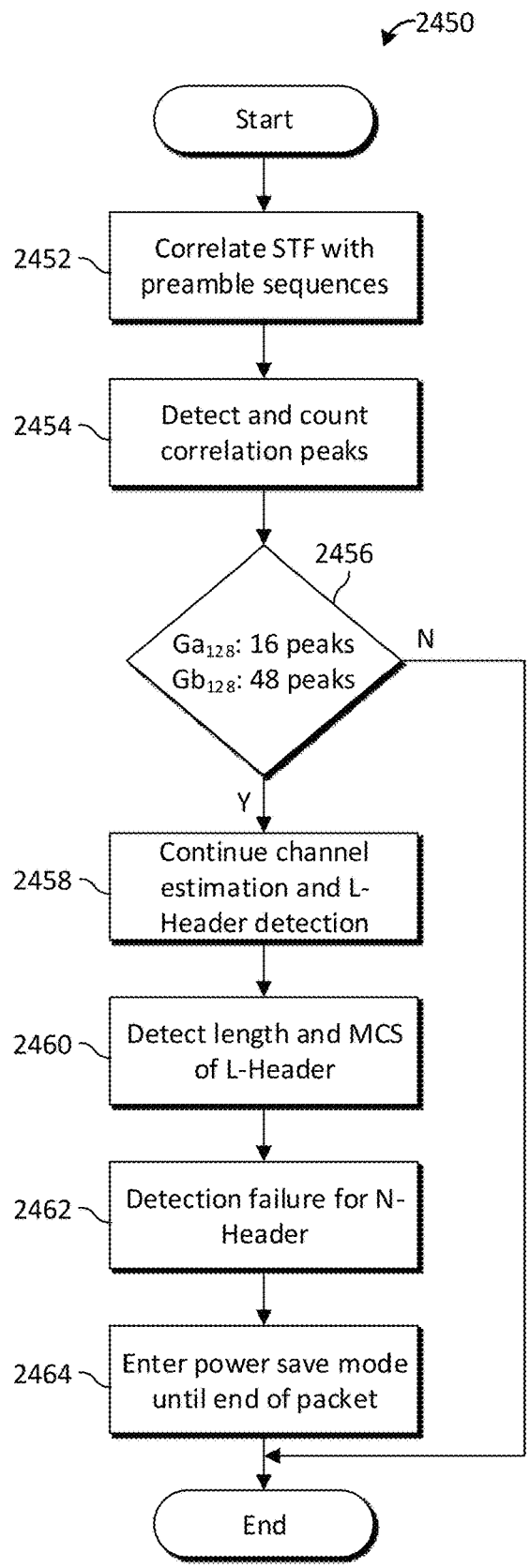

FIG. 24B is a diagram of an embodiment 802.11ad auto-detection method 2450. The 802.11ad auto-detection method 2450 may be indicative of operations occurring in an 802.11ad receiver when determining the PHY packet type of a received packet using the STF. Because an 802.11ad receiver may not capable of detecting an 802.11ay packet, the 802.11ad auto-detection method 2450 may thus avoid incorrectly identifying a received 802.11ay packet as a compatible packet for an 802.11ad receiver.

The 802.11ad auto-detection method 2450 begins by receiving an 802.11ay STF and correlating it with the preamble component sequences $Ga_{128}$ and $Gb_{128}$ (step 2452). Next, the correlation peaks for each preamble component sequence are detected and counted (step 2454). If correlation of the received STF does not produce 16 peaks for the preamble component sequence $Ga_{128}$ or 48 peaks for the preamble component sequence $Gb_{128}$ (step 2456), then auto-detection fails and the 802.11ad auto-detection method 2450 concludes.

However, if correlation of the received STF produces 16 peaks for the preamble component sequence $Ga_{128}$ or 48 peaks for the preamble component sequence $Gb_{128}$ (step 2456), then channel estimation and L-Header detection of the received 802.11ay PHY packet is performed (step 2458). Next, the PHY packet length and the MCS of the L-Header is detected (Step 2460). Next, a detection failure occurs when detecting the N-Header because the 802.11ad receiver is incompatible with an 802.11ay PHY packet (step 2462). Finally, this failure causes the receiver to enter power save mode until the end of the current PHY packet is detected. Accordingly, an 802.11ad receiver may be capable of detecting reception of either an 802.11ay or an 802.11ad PHY packet during STF correlation, and then may gracefully fail auto-detection of an incompatible 802.11ay PHY packet after STF detection and during channel estimation and header detection. By failing auto-detection at a later stage, an 802.11ad receiver may be able to enter power save mode after receiving an incompatible PHY packet, increasing power efficiency of the receiver.

Figure 25A:
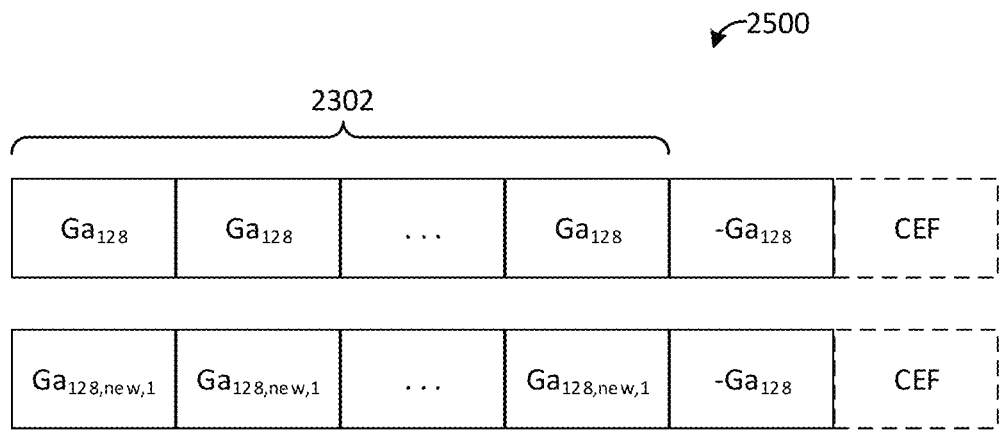
Figure 25B:
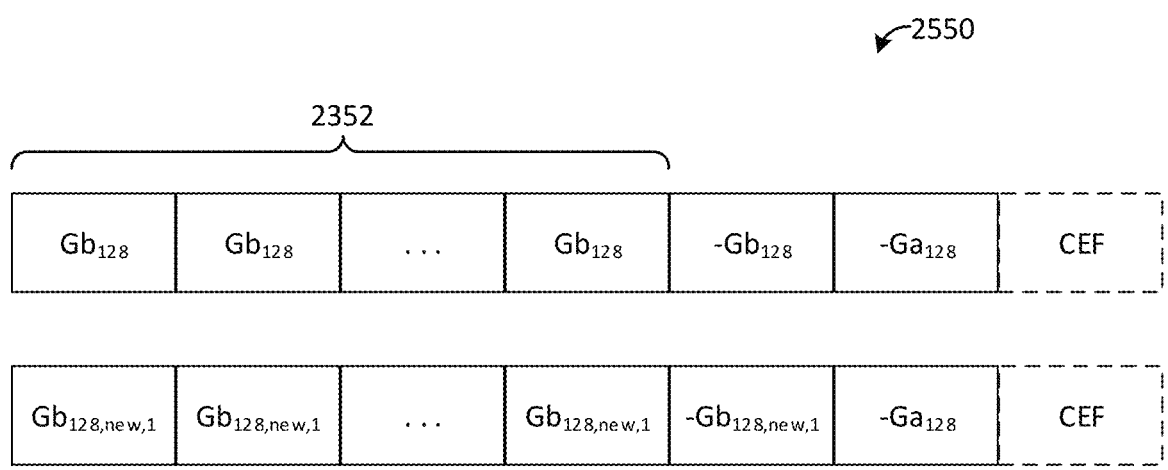

FIGS. 25A and 25B are diagrams of antenna transmission configurations 2500, 2550 for a non-control STF and a control STF, respectively. The antenna transmission configuration 2500 may be indicative of signals transmitted to produce the non-control STF 2300. Likewise, the antenna transmission configuration 2550 may be indicative of signals transmitted to produce the control STF 2350. Because the preamble component sequences $A_{128}$ and $B_{128}$ are QPSK-modulated variants of the preamble component sequences $Ga_{128}$ and $Gb_{128}$, an 802.11ay transmitter may produce the non-control STF 2300 and the control STF 2350 by transmitting orthogonal variants of the non-control STF 400 and the control STF 450, respectively. The orthogonal sequences may be combined by transmitting each sequence on a different antenna. For example, a real portion of the preamble component sequences $A_{128}$ and $B_{128}$ may be transmitted on a first antenna, and an imaginary portion of the preamble component sequences $A_{128}$ and $B_{128}$ may be transmitted on a second antenna.

Because one of each of the transmitted sequences includes the preamble component sequences $Ga_{128}$ and $Gb_{128}$, and 802.11ad receiver may thus receive the incompatible PHY packets and perform channel estimation and header detection of the PHY packet before failing auto-detection and entering power save mode. Likewise, an 802.11ay receiver may receive the PHY packet and perform auto-detection by correlating with the preamble component sequences $A_{128}$, $B_{128}$, $Ga_{128}$, and $Gb_{128}$. Auto-detection of the received PHY packets by a receiver may be performed using a method similar to the 802.11ay auto-detection method 2400 and the 802.11ad auto-detection method 2450, discussed above.

Figure 26:
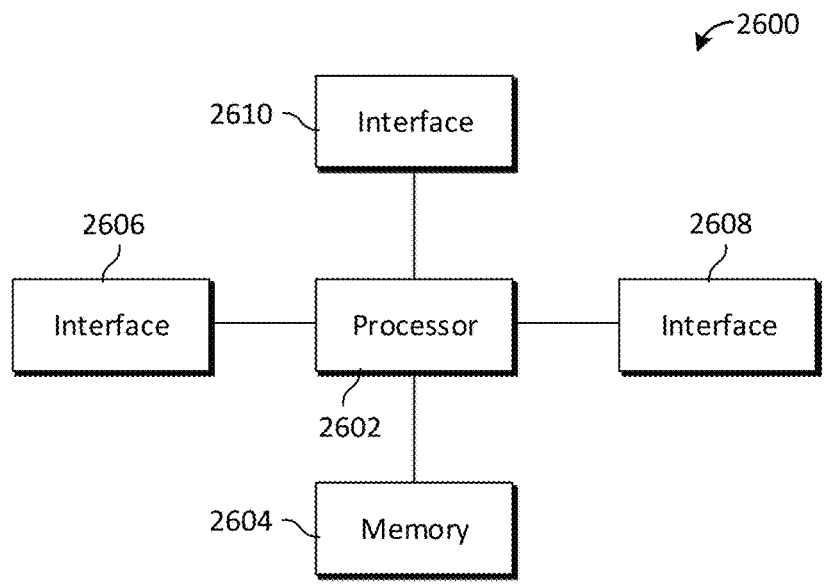
FIG. 26 is a diagram of an embodiment processing system.

FIG. 26 is a block diagram of an embodiment processing system 2600 for performing methods described herein, which may be installed in a host device. As shown, the processing system 2600 includes a processor 2602, a memory 2604, and interfaces 2606-2610, which may (or may not) be arranged as shown in FIG. 26. The processor 2602 may be any component or collection of components adapted to perform computations and/or other processing related tasks, and the memory 2604 may be any component or collection of components adapted to store programming and/or instructions for execution by the processor 2602. In an embodiment, the memory 2604 includes a non-transitory computer readable medium. The interfaces 2606, 2608, 2610 may be any component or collection of components that allow the processing system 2600 to communicate with other devices/components and/or a user. For example, one or more of the interfaces 2606, 2608, 2610 may be adapted to communicate data, control, or management messages from the processor 2602 to applications installed on the host device and/or a remote device. As another example, one or more of the interfaces 2606, 2608, 2610 may be adapted to allow a user or user device (e.g., personal computer (PC), etc.) to interact/communicate with the processing system 2600. The processing system 2600 may include additional components not depicted in FIG. 26, such as long term storage (e.g., non-volatile memory, etc.).

In some embodiments, the processing system 2600 is included in a network device that is accessing, or part otherwise of, a telecommunications network. In one example, the processing system 2600 is in a network-side device in a wireless or wireline telecommunications network, such as a base station, a relay station, a scheduler, a controller, a gateway, a router, an applications server, or any other device in the telecommunications network. In other embodiments, the processing system 2600 is in a user-side device accessing a wireless or wireline telecommunications network, such as a mobile station, a user equipment (UE), a personal computer (PC), a tablet, a wearable communications device (e.g., a smartwatch, etc.), or any other device adapted to access a telecommunications network.

Figure 27:
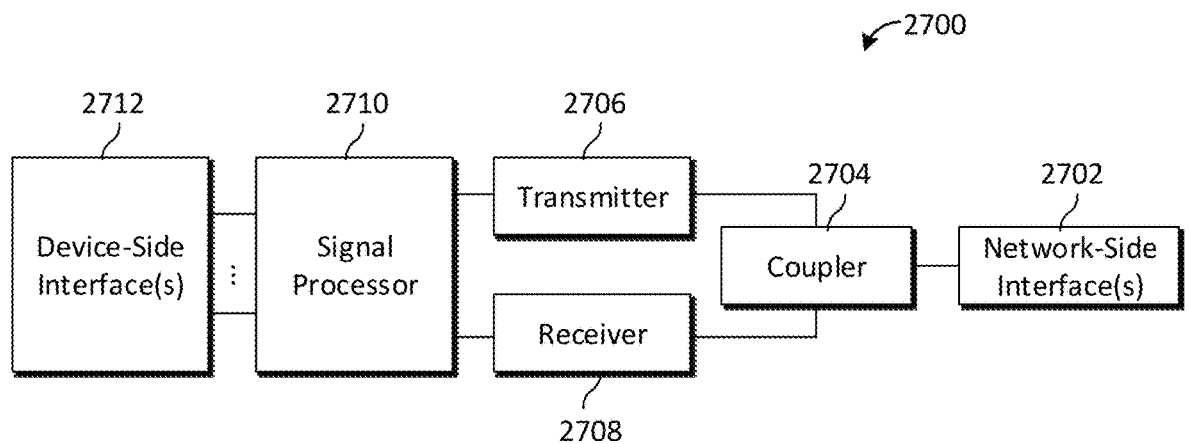
FIG. 27 is a block diagram of a transceiver.

In some embodiments, one or more of the interfaces 2606, 2608, 2610 connects the processing system 2600 to a transceiver adapted to transmit and receive signaling over the telecommunications network. FIG. 27 is a block diagram of a transceiver 2700 adapted to transmit and receive signaling over a telecommunications network. The transceiver 2700 may be installed in a host device. As shown, the transceiver 2700 comprises a network-side interface 2702, a coupler 2704, a transmitter 2706, a receiver 2708, a signal processor 2710, and a device-side interface 2712. The network-side interface 2702 may include any component or collection of components adapted to transmit or receive signaling over a wireless or wireline telecommunications network. The coupler 2704 may include any component or collection of components adapted to facilitate bi-directional communication over the network-side interface 2702. The transmitter 2706 may include any component or collection of components (e.g., up-converter, power amplifier, etc.) adapted to convert a baseband signal into a modulated carrier signal suitable for transmission over the network-side interface 2702. The receiver 2708 may include any component or collection of components (e.g., down-converter, low noise amplifier, etc.) adapted to convert a carrier signal received over the network-side interface 2702 into a baseband signal. The signal processor 2710 may include any component or collection of components adapted to convert a baseband signal into a data signal suitable for communication over the device-side interface(s) 2712, or vice-versa. The device-side interface(s) 2712 may include any component or collection of components adapted to communicate data-signals between the signal processor 2710 and components within the host device (e.g., the processing system 2600, local area network (LAN) ports, etc.).

The transceiver 2700 may transmit and receive signaling over any type of communications medium. In some embodiments, the transceiver 2700 transmits and receives signaling over a wireless medium. For example, the transceiver 2700 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 2702 comprises one or more antenna/radiating elements. For example, the network-side interface 2702 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 2700 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A wireless device comprising:
   at least one processor; and
   a non-transitory computer readable storage medium storing instructions that, when executed by the at least one processor, cause the wireless device to perform operations including:
   transmitting in a 60 GHz frequency band a wireless packet, the wireless packet comprising a first header and a second header, the first header carrying a plurality of bits, a logical value of a subset of the plurality of bits in the first header indicating presence of the second header in the wireless packet, both of the first header and the second header being physical layer packet headers, the first header carrying a first parameter indicating a first IEEE 802.11 protocol packet type, the second header carrying a second parameter indicating a second IEEE 802.11 protocol packet type, the second parameter indicating a number of bonded channels, wherein multiple input multiple output (MIMO) is not supported by the first IEEE 802.11 protocol packet type but supported by the second IEEE 802.11 protocol packet type, wherein channel bonding is not supported by the first IEEE 802.11 protocol packet type, and wherein the second header further carries one or more third parameters indicating a MIMO type, a MIMO order, or a combination thereof.

2. The wireless device of claim 1, wherein the wireless packet is a control packet, and wherein the plurality of bits includes 24 bits.

3. The wireless device of claim 1, wherein the wireless packet is one of a single carrier (SC) packet or an orthogonal frequency-division multiplexed (OFDM) packet, and wherein the plurality of bits includes 48 bits.

4. The wireless device of claim 1, wherein the wireless packet further comprises a payload and a training field.

5. The wireless device of claim 1, wherein the wireless packet further comprises a first short training field, a second short training field, a first channel estimation field, and a second channel estimation field.

6. A wireless device comprising:
   at least one processor; and
   a non-transitory computer readable storage medium storing instructions that, when executed by the at least one processor, cause the wireless device to perform operations including:
   receiving in a 60 GHz band a wireless packet, the wireless packet comprising a first header and a second header, the first header carrying a plurality of bits, both of the first header and the second header being physical layer packet headers, the first header carrying a first parameter indicating a first IEEE 802.11 protocol packet type, the second header carrying a second parameter indicating a second IEEE 802.11 protocol packet type, wherein multiple input multiple output (MIMO) is not supported by the first IEEE 802.11 protocol packet type but supported by the second IEEE 802.11 protocol packet type, the second parameter indicating a number of bonded channels, wherein channel bonding is not supported by the first IEEE 802.11 protocol packet type, and wherein the second header further carries one or more third parameters indicating a MIMO type, a MIMO order, or a combination thereof; and
   determining presence of the second header in the wireless packet according to a logical value of a subset of the plurality of bits in the first header.

7. The wireless device of claim 6, wherein the wireless packet is a control packet, and wherein the plurality of bits includes 24 bits.

8. The wireless device of claim 6, wherein the wireless packet is one of a single carrier (SC) packet or an orthogonal frequency-division multiplexed (OFDM) packet, and wherein the plurality of bits includes 48 bits.

9. The wireless device of claim 6, wherein the wireless packet further comprises a payload and a training field.

10. The wireless device of claim 6, wherein the wireless packet further comprises a first short training field, a second short training field, a first channel estimation field, and a second channel estimation field.

11. A chipset comprising:
    at least one processor; and
    a non-transitory computer readable storage medium storing instructions that, when executed by the at least one processor, cause the chipset to perform operations including:
    outputting a wireless packet to a system bus for transmission on a 60 GHz frequency band, the wireless packet comprising a first header and a second header, the first header carrying a plurality of bits, a logical value of a subset of the plurality of bits in the first header indicating presence of the second header in the wireless packet, both of the first header and the second header being physical layer packet headers, the first header carrying a first parameter indicating a first IEEE 802.11 protocol packet type, the second header carrying a second parameter indicating a second IEEE 802.11 protocol packet type, the second parameter indicating a number of bonded channels, wherein multiple input multiple output (MIMO) is not supported by the first IEEE 802.11 protocol packet type but supported by the second IEEE 802.11 protocol packet type, wherein channel bonding is not supported by the first IEEE 802.11 protocol packet type, and wherein the second header further carries one or more third parameters indicating a MIMO type, a MIMO order, or a combination thereof.

12. The chipset of claim 11, wherein the wireless packet is a control packet, and wherein the plurality of bits includes 24 bits.

13. The chipset of claim 11, wherein the wireless packet is one of a single carrier (SC) packet or an orthogonal frequency-division multiplexed (OFDM) packet, and wherein the plurality of bits includes 48 bits.

14. The chipset of claim 11, wherein the wireless packet further comprises a payload and a training field.

15. The chipset of claim 11, wherein the wireless packet further comprises a first short training field, a second short training field, a first channel estimation field, and a second channel estimation field.

16. A chipset comprising:
at least one processor; and
a non-transitory computer readable storage medium storing instructions that, when executed by the at least one processor, cause the chipset to perform operations including:
reading a wireless packet from a system bus, the wireless packet received on a 60 GHz band, the wireless packet comprising a first header and a second header, the first header carrying a plurality of bits, both of the first header and the second header being physical layer packet headers, the first header carrying a first parameter indicating a first IEEE 802.11 protocol packet type, the second header carrying a second parameter indicating a second IEEE 802.11 protocol packet type, the second parameter indicating a number of bonded channels, wherein multiple input multiple output (MIMO) is not supported by the first IEEE 802.11 protocol packet type but supported by the second IEEE 802.11 protocol packet type, wherein channel bonding is not supported by the first IEEE 802.11 protocol packet type, and wherein the second header further carries one or more third parameters indicating a MIMO type, a MIMO order, or a combination thereof; and
determine presence of the second header in the wireless packet according to a logical value of a subset of the plurality of bits in the first header.

17. The chipset of claim 16, wherein the wireless packet is a control packet, and wherein the plurality of bits includes 24 bits.

18. The chipset of claim 16, wherein the wireless packet is one of a single carrier (SC) packet or an orthogonal frequency-division multiplexed (OFDM) packet, and wherein the plurality of bits includes 48 bits.

19. The chipset of claim 16, wherein the wireless packet further comprises a payload and a training field.

20. The chipset of claim 16, wherein the wireless packet further comprises a first short training field, a second short training field, a first channel estimation field, and a second channel estimation field.

* * * * *

UNITED STATES PATENT AND TRADEMARK OFFICE
CERTIFICATE OF CORRECTION

| | | |
|---|---|---|
| PATENT NO. | : 12,155,399 B2 | Page 1 of 3 |
| APPLICATION NO. | : 18/300907 | |
| DATED | : November 26, 2024 | |
| INVENTOR(S) | : Xin et al. | |

It is certified that error appears in the above-identified patent and that said Letters Patent is hereby corrected as shown below:

In the Specification

In Column 5, Line 50, delete "802.11lay" and insert -- 802.11ay --.

In Column 7, Line 48, delete "Gam" and insert -- $Ga_{128}$ --.

In Column 8, Line 22, delete "-Gam" and insert -- $-Ga_{128}$ --.

In Column 8, Line 34, delete "$Gb_{28}$," and insert -- $Gb_{128}$, --.

In Column 11, Line 38, delete "$(r_1,r_2, \ldots r_{2176})$" and insert -- $(r_1,r_2, \ldots, r_{2176})$ --.

In Column 11, Line 51, delete "$r_n \in \{1,-1\} n=1,2,\ldots, 2176 \theta_n \in (0,2\pi) n=1,2,\ldots,$" and insert -- $(r_1,r_2, \ldots, r_{2176})$ --.

In Column 11, Line 52, delete "2176".

In Column 11, Line 53, delete "and." and insert -- $r_n \in \{1, -1\}$ and $n = 1, 2, \ldots, 2176$. --.

In Column 11, Line 57, delete "2, . . . ,2176".

In Column 11, Line 59, delete "and" and insert -- $\theta_n \in (0, 2\pi)$ and n = 1, 2, ..., 2176. --.

In Column 11, Line 60, delete "$r_n \in \{1,-1\} n=1,2,\ldots,2176 \theta_n \in (0,2\pi) n=1,$".

In Column 11, Line 61, delete "2, . . . ,2176".

In Column 11, Line 63, delete "$r_n \in \{1,-1\} n=1,2,\ldots,2176 \theta_n \in (0,2\pi) n=1,$".

Signed and Sealed this
Sixth Day of May, 2025

Coke Morgan Stewart
*Acting Director of the United States Patent and Trademark Office*

CERTIFICATE OF CORRECTION (continued)
U.S. Pat. No. 12,155,399 B2

In Column 11, Line 64, delete "2, . . . ,2176".

In Column 11, Line 65, delete "$(r_1,r_2, \ldots, r_{6400})r_n \in \{1,-1\}n=1,2, \ldots, 6400(r_1 e^{j\theta_1}$,".

In Column 11, Line 66, delete "6400".

In Column 12, Line 3, delete "$r_n \in \{1,-1\}n=1,2, \ldots, 6400\theta n \in (0,2\pi)n=1$," and insert -- $(r_1, r_2, \ldots, r_{2176})$ --.

In Column 12, Line 4, delete "2, . . . ,6400".

In Column 12, Line 5, delete "and." and insert -- $r_n \in \{1,-1\}$ and n = 1, 2, ..., 2176. --.

In Column 12, Line 12, delete "$r_n \in \{1, -1\} n = 1, 2, \ldots, 6400 \theta_n \in (0, 2\pi) n = 1, 2, \ldots, 6400$ and" and insert -- where $\theta_n \in (0, 2\pi)$ and $n = 1, 2, \ldots, 6400$. --.

In Column 12, Line 13, delete "$r_n \in \{1, -1\} n = 1, 2, \ldots, 6400 \theta_n \in (0,2\pi) n = 1, 2, \ldots, 6400$.".

In Column 12, Line 38 and 39, delete
"$e^{j\pi \frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$" and insert -- $r_{STF}(nT_c) = \begin{cases} Ga_{128} * (n \bmod 128) * e^{j\pi\frac{n}{2}}, n = 0,1,\ldots,16*128 - 1 \\ -Ga_{128} * (n \bmod 128) * e^{j\pi\frac{n}{2}}, n = 16*128, \ldots, 17*128 - 1 \end{cases}$ --.

In Column 12, Line 49, delete "rotation, may" and insert -- rotation, $e^{j\theta_n}$, may --.

In Column 12, Line 52, delete "rotation, is used for 802.11ay, where, e.g., etc." and insert
-- rotation $e^{jn\varphi}$ is used for 802.11ay, where $\varphi \neq \frac{\pi}{2}$, e.g., $\varphi = \frac{\pi}{4}, \frac{3\pi}{4}, \frac{\pi}{8}, \frac{3\pi}{8}, \frac{5\pi}{8}$, etc. --.

In Column 12, Line 65 and 66, delete "$e^{j\pi\frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$".

In Column 13, Line 1 through 3, delete "-continued $e^{j\pi\frac{n}{2}} e^{j\theta_n} \theta_n \neq \frac{n\pi}{2} e^{jn\varphi} \varphi \neq \frac{\pi}{2} \varphi = \frac{\pi}{4}, \frac{3\pi}{4}, \frac{\pi}{8}, \frac{3\pi}{8}, \frac{5\pi}{8},$".

In Column 17, Line 13, delete "Gam," and insert -- $Ga_{128}$, --.

In Column 19, Line 15, delete "Gam," and insert -- $Ga_{128}$, --.

CERTIFICATE OF CORRECTION (continued)
U.S. Pat. No. 12,155,399 B2

In Column 20, Lines 60-62, delete "$0<\alpha,\beta<1,\alpha^2+\beta^2=10<\alpha,\beta<1,\alpha^2+\beta^2<1$" and insert -- $$A_{128} = \alpha \cdot Ga_{128} + \beta \cdot Ga_{128,new,1} \cdot e^{j\pi/2}$$
and
$$B_{128} = \alpha \cdot Gb_{128} + \beta \cdot Gb_{128,new,1} \cdot e^{j\pi/2}$$ --.

In Column 20, Line 63, delete "where." and insert -- where $0 < \alpha, \beta < 1, \alpha^2 + \beta^2 = 1$. --.

In Column 21, Lines 4-6, delete "$0<\alpha,\beta<1,\alpha^2+\beta^2=10<\alpha,\beta<1,\alpha^2+\beta^2=1$ and $0<\alpha,\beta<1,\alpha^2+\beta^2=10<\alpha,\beta<1,\alpha^2+\beta^2<1$" and insert -- $$A_{128}' = \alpha \cdot Ga_{128} + \beta \cdot Gb_{128,new,1} \cdot e^{j\pi/2}$$
and
$$B_{128}' = \alpha \cdot Gb_{128} + \beta \cdot Ga_{128,new,1} \cdot e^{j\pi/2}$$ --.

In Column 21, Line 8, delete "where." and insert -- where $0 < \alpha, \beta < 1, \alpha^2 + \beta^2 = 1$. --.

In Column 21, Lines 15-22, delete "$0<\alpha,\beta<1,\alpha^2+\beta^2=10<\alpha,\beta<1,\alpha^2+\beta^2=1$ $0<\alpha,\beta<1,\alpha^2+\beta^2=10<\alpha,\beta<1,\alpha^2+\beta^2=1$ $0<\alpha,\beta<1,\alpha^2+\beta^2=10<\alpha,\beta<1,\alpha^2+\beta^2=1$ $0<\alpha,\beta<1,\alpha^2+\beta^2=10<\alpha,\beta<1,\alpha^2+\beta^2=1$".

In Column 22, Line 7, delete "Gam" and insert -- $Ga_{128}$ --.